(12) United States Patent
    Tamiya

(10) Patent No.: US 10,700,108 B2
(45) Date of Patent: Jun. 30, 2020

(54) SOLID-STATE IMAGING DEVICE

(71) Applicant: OLYMPUS CORPORATION, Hachioji-shi, Tokyo (JP)

(72) Inventor: Kosei Tamiya, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 580 days.

(21) Appl. No.: 15/631,283

(22) Filed: Jun. 23, 2017

(65) Prior Publication Data

US 2017/0294467 A1    Oct. 12, 2017

Related U.S. Application Data

(63) Continuation of application No. PCT/JP2015/050523, filed on Jan. 9, 2015.

(51) Int. Cl.
| | |
|---|---|
| *H01L 27/146* | (2006.01) |
| *H04N 5/33* | (2006.01) |
| *H04N 5/369* | (2011.01) |

(52) U.S. Cl.
CPC .. *H01L 27/14605* (2013.01); *H01L 27/14607* (2013.01); *H01L 27/14621* (2013.01);
(Continued)

(58) Field of Classification Search
CPC .................. H01L 27/14647; H04N 5/379
See application file for complete search history.

(56) References Cited

U.S. PATENT DOCUMENTS

| 7,872,234 B2 | 1/2011 | Nam |
|---|---|---|
| 2011/0049333 A1 | 3/2011 | Yamashita |

(Continued)

FOREIGN PATENT DOCUMENTS

| JP | 2010-81609 A | 4/2010 |
|---|---|---|
| JP | 2011-49240 A | 3/2011 |

(Continued)

OTHER PUBLICATIONS

Kim et al., "A 1.5Mpixel RGBX CMOS Image Sensor for Simultaenous Color and Range Image Capture", Solid-State Circuits Conference Digest of Technical Papers (ISSCC), Session 22/Image Sensors/22.7 (2012) IEEE International, Cited in Specification. (3 pages).

(Continued)

*Primary Examiner* — Thanh Luu
(74) *Attorney, Agent, or Firm* — Westerman, Hattori, Daniels & Adrian, LLP

(57) ABSTRACT

A solid-state imaging device includes a first semiconductor substrate in which first photoelectric conversion layers photoelectrically converting incident light in a first wavelength band are formed, a second semiconductor substrate in which second photoelectric conversion layers photoelectrically converting incident light are formed, a conductive layer disposed between the first semiconductor substrate and the second semiconductor substrate and having conductivity, an insulation film disposed between the second semiconductor substrate and the conductive layer and having an insulation property, in which light passing through the first photoelectric conversion layer, the conductive layer, and the insulation film is incident on the second semiconductor substrate, a predetermined voltage is applied to the conductive layer, and a wavelength of light in a second wavelength band photoelectrically converted by the second photoelectric conversion layer when the predetermined voltage is applied to the conductive layer is longer than when the predetermined voltage is not applied.

12 Claims, 12 Drawing Sheets

(52) U.S. Cl.
CPC ....... *H01L 27/14623* (2013.01); *H04N 5/332* (2013.01); *H04N 5/369* (2013.01); *H04N 5/379* (2018.08); *H01L 2924/0002* (2013.01)

(56) References Cited

U.S. PATENT DOCUMENTS

| | | |
|---|---|---|
| 2014/0042577 A1 | 2/2014 | Aoki |
| 2015/0129747 A1* | 5/2015 | Petilli ............... H01L 27/14627 250/208.1 |

FOREIGN PATENT DOCUMENTS

| | | |
|---|---|---|
| JP | 2011-530165 A | 12/2011 |
| JP | 2012-506206 A | 3/2012 |
| JP | 2014-39078 A | 2/2014 |
| JP | 5604703 B1 | 10/2014 |
| WO | 2010/014138 A1 | 2/2010 |
| WO | 2010/044826 A2 | 4/2010 |

OTHER PUBLICATIONS

Lyu et al., "IR/Color Composite Image Sensor with VIPS(Vertically Integrated Photodiode Structure)", International Image Sensor Workshop (IISW), (2007), Cited in Specification. (4 pages).

International Search Report dated Mar. 17, 2015, issued in counterpart of International Application No. PCT/JP2015/050523, w/English Translation. (4 pages).

* cited by examiner

SOLID-STATE IMAGING DEVICE

This application is a continuation application based on PCT Patent Application No. PCT/JP2015/050523, filed Jan. 9, 2015, the content of which is incorporated herein by reference.

TECHNICAL FIELD

The present invention relates to a solid-state imaging device.

BACKGROUND ART

Conventionally, a plurality of technologies related to a solid-state imaging device which receives visible light and near infrared light have been disclosed. In such a solid-state imaging device, it is possible to acquire a normal image obtained by visible light (hereinafter referred to as "visible light image"), and an image containing information on a distance to an object and the like, which is obtained by near infrared light (hereinafter referred to as "near infrared light image"), using one solid-state imaging device.

For example, Japanese Unexamined Patent Application, First Publication No. 2010-081609 discloses a solid-state imaging device in which each of a normal pixel receiving visible light (hereinafter referred to as "visible light detection pixel", and a pixel for near infrared light receiving near infrared light (hereinafter referred to as "near infrared light detection pixel") is disposed on the same surface in a pixel region. More specifically, in the solid-state imaging device disclosed in Japanese Unexamined Patent Application, First Publication No. 2010-081609, a set of four visible light detection pixels of red (R), green (G), blue (B), and green (G) vertically and horizontally adjacent to each other, which are handled as one set in a general solid-state imaging device that does not receive near infrared light, and a pixel for near infrared light are arranged in a zigzag pattern at positions that do not overlap each other in a pixel region. To the solid-state imaging device disclosed in Japanese Unexamined Patent Application, First Publication No. 2010-081609, a technology is thought to be applied, for example, a technology as disclosed in "A 1.5MPixel RGBZ CMOS Image Sensor for Simultaneous Color and Range Image Capture", Solid-State Circuits Conference Digest of Technical Papers (ISSCC), Session 22/Image Sensore/22.7, 2012 IEEE International, February 2012 (hereinafter referred to as "Literature Document 1"). More specifically, a potential barrier for prevention of effects of charges due to near infrared light (that is, for prevention of the charges due to near infrared light from leaking in) is thought to be disposed in detection pixels arranged in the zigzag pattern.

In addition, for example, in U.S. Pat. No. 7,872,234, and "IR/Color Composite Image Sensor with VIPS (Vertically Integrated Photodiode Structure)", International Image Sensor Workshop (IISW), 2007 (hereinafter referred to as "Literature Document 2"), a solid-state imaging device in which each of the visible light detection pixel and the near infrared light detection pixel are formed in the same silicon substrate while the positions of each group of pixels is changed in the depth direction. More specifically, each of a depletion layer at a deep position which is ion-implanted with high energy, and a depletion layer at a position close to a surface (shallow position) which is ion-implanted with ordinary energy is formed on the same silicon substrate. In U.S. Pat. No. 7,872,234 and Literature Document 2, visible light is detected by a visible light detection pixel in which a depletion layer is formed at a shallow position, and near infrared light is detected by a pixel for near infrared light in which a depletion layer is formed at a deep position. For this reason, in the solid-state imaging device disclosed in U.S. Pat. No. 7,872,234, and Literature Document 2, a color filter affixed to correspond to each visible light detection pixel has a characteristic of transmitting both of visible light and near infrared light. This is because, the visible light detection pixel and the near infrared light detection pixel are formed at the same position, when a pixel region of the solid-state imaging device is seen from a light receiving surface side, each of visible light and near infrared light is detected depending on a difference in a depth direction.

However, although a technology disclosed in each of Japanese Unexamined Patent Application, First Publication No. 2010-081609, to which the technology of Literature Document 1 is applied, U.S. Pat. No. 7,872,234, and Literature Document 2 is a technology which are able to detect visible light and near infrared light by one solid-state imaging device, a solid-state imaging device to which each technology is applied is not able to separate visible light and near infrared light with high accuracy and detect each type of light due to the following problems.

In a solid-state imaging device disclosed in Japanese Unexamined Patent Application, First Publication No. 2010-081609, with the technology of Literature Document 1 being applied, visible light is also incident on a near infrared light detection pixel. In this case, a near infrared light detection pixel has a sensitivity to a wide range of light from visible light to near infrared light. Therefore, the near infrared light detection pixel detects not only the near infrared light but also the visible light (that is, charges due to visible light are mixed with charges due to near infrared light), and not able to detect only near infrared light. Moreover, in an arrangement of pixels of the solid-state imaging device disclosed in Japanese Unexamined Patent Application, First Publication No. 2010-081609, there is no visible light detection pixel at a position at which the near infrared light detection pixel is arranged. Therefore, in an imaging system equipped with the solid-state imaging device disclosed in Japanese Unexamined Patent Application, First Publication No. 2010-081609, the position at which the near infrared light detection pixel is arranged is handled as a defective pixel in processing of generating a visible light image.

In addition, the solid-state imaging device disclosed in U.S. Pat. No. 7,872,234, and Literature Document 2 is configured to separately detect each type of visible light and near infrared light depending on a difference in a depth direction. For this reason, it is not possible to dispose a potential barrier serving to separate visible light and near infrared light, for example, as in the technology disclosed in Literature Document 1, between the visible light detection pixel and the near infrared light detection pixel. Therefore, charges due to near infrared light may leak into the visible light detection pixel. In addition, conversely, charges due to visible light (particularly, charges due to red (R) visible light) may also leak into the near infrared light detection pixel.

For this reason, the solid-state imaging device disclosed in each of Japanese Unexamined Patent Application, First Publication No. 2010-081609, to which the technology of Literature Document 1 is applied, U.S. Pat. No. 7,872,234, and Literature Document 2 are not able to separate and detect visible light and near infrared light with high accuracy unless the solid-state imaging device is used under specific imaging conditions such as sufficiently bright illumination and the like.

SUMMARY OF INVENTION

A solid-state imaging device according to a first aspect of the present invention includes a first semiconductor substrate in which first photoelectric conversion layers that photoelectrically convert incident light in a first wavelength band are formed in a two-dimensional matrix shape, a second semiconductor substrate in which second photoelectric conversion layers that photoelectrically convert incident light are formed in a two-dimensional matrix shape, a conductive layer which is disposed between the first semiconductor substrate and the second semiconductor substrate and has conductivity corresponding to the second photoelectric conversion layer, and an insulation film which is disposed between the second semiconductor substrate and the conductive layer and has an insulation property corresponding to the second photoelectric conversion layer, in which light that has passed through the first photoelectric conversion layer, the conductive layer, and the insulation film is incident on the second semiconductor substrate, a predetermined voltage is applied to the conductive layer, and a wavelength of light in a second wavelength band which is photoelectrically converted by the second photoelectric conversion layer when the predetermined voltage is applied to the conductive layer is longer than a wavelength of light in a wavelength band which is photoelectrically converted by the second photoelectric conversion layer when the predetermined voltage is not applied to the conductive layer.

According to a second aspect of the present invention, the solid-state imaging device according to the first aspect may further include a first optical filter which shields light from a predetermined first wavelength to a predetermined second wavelength longer than the first wavelength, in which the first semiconductor substrate may be disposed between the first optical filter and the second semiconductor substrate, an upper limit wavelength of the first wavelength band may be a wavelength shorter than the first wavelength, and a lower limit wavelength of the second wavelength band may be a wavelength longer than the second wavelength.

According to a third aspect of the present invention, the solid-state imaging device according to the second aspect may further include a second optical filter which is disposed between the first semiconductor substrate and the conductive layer and shields light of a wavelength equal to or less than a predetermined third wavelength, in which the third wavelength may be equal to or greater than the first wavelength and equal to or less than the second wavelength.

According to a fourth aspect of the present invention, in the solid-state imaging device according to the third aspect, a lower limit wavelength of light shielded by the second optical filter may be a wavelength equal to or less than a lower limit wavelength of light photoelectrically converted by the second photoelectric conversion layer.

According to a fifth aspect of the present invention, in the solid-state imaging device according to the fourth aspect, the second optical filter may shield at least red wavelength light.

According to a sixth aspect of the present invention, in the solid-state imaging device according to the first aspect, the first photoelectric conversion layer and the second photoelectric conversion layer may be a PN junction type photoelectric conversion unit, and a first N-type semiconductor layer which forms the first photoelectric conversion layer may be thinner than a second N-type semiconductor layer which forms the second photoelectric conversion layer.

According to a seventh aspect, in the solid-state imaging device according to the sixth aspect, a concentration of impurities when the first N-type semiconductor layer is formed may be the same as a concentration of impurities when the second N-type semiconductor layer is formed, or may be higher than the concentration of impurities when the second N-type semiconductor layer is formed.

According to an eighth aspect of the present invention, in the solid-state imaging device according to the first aspect, the first photoelectric conversion layer may have any one of a first color filter transmitting red wavelength light, a second color filter transmitting green wavelength light, and a third color filter transmitting blue wavelength light disposed on a side on which light in the first wavelength band is incident, and each of the first color filter, the second color filter, and the third color filter may further transmit at least light in the second wavelength band.

According to a ninth aspect of the present invention, the solid-state imaging device according to the first aspect may further include an anti-reflection film which is disposed between the first semiconductor substrate and the conductive layer and prevents reflection of light that has passed through the first photoelectric conversion layer.

According to a tenth aspect of the present invention, the solid-state imaging device according to the first aspect may further include a gate voltage control unit which controls the predetermined voltage applied to the conductive layer.

According to an eleventh aspect of the present invention, in the solid-state imaging device according to the tenth aspect, the gate voltage control unit may controls the predetermined voltage to be different voltage values for each conductive layer corresponding to the second photoelectric conversion layer, or for each of the plurality of conductive layers.

According to a twelfth aspect of the present invention, the solid-state imaging device according to the first aspect may further includes a calculation processing unit which generates an electric signal containing only near infrared light on the basis of a first electric signal photoelectrically converted by the second photoelectric conversion layer when the near infrared light is emitted and a second electric signal photoelectrically converted by the second photoelectric conversion layer when the near infrared light is not emitted.

DESCRIPTION OF EMBODIMENTS

First Embodiment

Figure 1:
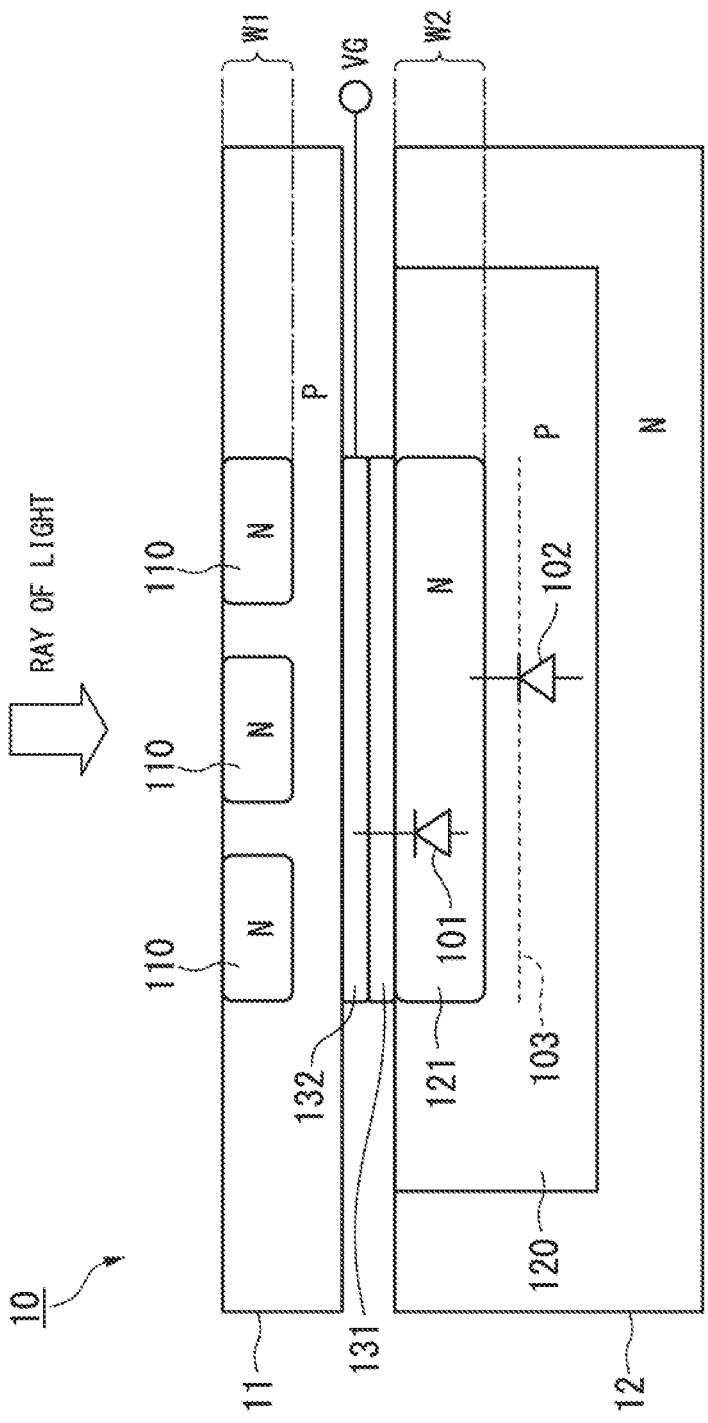
FIG. 1 is a diagram which shows a schematic structure of a solid-state imaging device according to a first embodiment of the present invention.

Hereinafter, embodiments of the present invention will be described with reference to drawings. FIG. 1 is a diagram which shows a schematic structure of a solid-state imaging device according to a first embodiment of the present invention. A solid-state imaging device 10 of the first embodiment is a solid-state imaging device capable of acquiring a normal image obtained by visible light (hereinafter referred to as "visible light image"), and an image obtained by near infrared light (hereinafter referred to as "near infrared light image"). This near infrared light image contains information on a distance to an object.

The solid-state imaging device 10 is configured by stacking a plurality of semiconductor substrates. In FIG. 1, the solid-state imaging device 10 of a configuration in which a first semiconductor substrate 11 and a second semiconductor substrate 12 are stacked (joined) is shown.

In the solid-state imaging device 10, a circuit for realizing a function of the solid-stage imaging device 10 is formed on each of the first semiconductor substrate 11 and the second semiconductor substrate 12. Examples of the circuit for realizing a function of the solid-state imaging device 10 include a pixel array portion in which a plurality of pixels including a photoelectric conversion unit such as a photodiode which converts incident light (rays of light) into an electric signal are arranged in a two-dimensional matrix shape, a column processing circuit which processes an electric signal (hereinafter referred to as "pixel signal") photoelectrically converted by a photoelectric conversion unit, a drive circuit for driving pixels in the pixel array portion, and the like. In addition, as the circuit for realizing a function of the solid-state imaging device 10, there is also a signal processing circuit which processes the pixel signal processed by the column processing circuit.

FIG. 1 shows a vertical structure of a portion of a pixel array portion formed in the solid-state imaging device 10 as seen from a side surface. The solid-state imaging device 10 detects and photoelectrically converts only visible light by a normal pixel (hereinafter referred to as "visible light detection pixel") formed on the first semiconductor substrate 11, disposed on the upper surface as seen from a side on which a ray of light is incident. In addition, the solid-state imaging device 10 detects and photoelectrically converts only near infrared light by a pixel (hereinafter referred to as "near infrared light detection pixel") for near infrared light formed on the second semiconductor substrate 12, disposed on the lower surface as seen from the side on which a ray of light is incident.

In the solid-state imaging device 10, a photoelectric conversion unit of a visible light detection pixel (photodiode) is configured by a PN junction of the first semiconductor substrate 11 which is a P-type semiconductor and an N-type semiconductor 110 formed on the first semiconductor substrate 11. A plurality of the photoelectric conversion units of visible light detection pixels are formed in the pixel array portion of the solid-state imaging device 10 in a two-dimensional matrix shape. FIG. 1 shows a state in which three N-type semiconductors 110 are formed in the first semiconductor substrate 11 (that is, three visible light detection pixels are formed in the first semiconductor substrate 11).

A structure of the first semiconductor substrate 11 is the same as a structure of a general solid-stage imaging device. Accordingly, the solid-state imaging device may also be a so-called back side illumination (BSI)-type solid-state imaging device in which the first semiconductor substrate 11 is joined to the second semiconductor substrate 12, so that a surface of a side on which a ray of light is incident is a silicon layer.

In addition, in the solid-state imaging device 10, an NPN semiconductor structure is formed by forming a P-type semiconductor 120 in the second semiconductor substrate 12 which is an N-type semiconductor and further forming the N-type semiconductor 121 in a region of the P-type semiconductor 120. A plurality of these NPN semiconductor structures are formed in a two-dimensional matrix shape corresponding to one or more of the photoelectric conversion units of visible light detection pixels formed in the first semiconductor substrate 11. FIG. 1 shows a state in which one NPN semiconductor structure is formed with respect to three N-type semiconductors 110 formed in the first semiconductor substrate 11 (that is, three visible light detection pixels formed in the first semiconductor substrate 11).

The solid-state imaging device 10 is made to satisfy following conditions when the N-type semiconductor 121 is formed in the second semiconductor substrate 12.

(Condition 1)
A thickness W2 of the N-type semiconductor 121 formed in the second semiconductor substrate 12 is formed to be thicker than a thickness W1 of the N-type semiconductor 110 formed in the first semiconductor substrate 11 (W2>W1).

(Condition 2)
A concentration X2 of impurities when the N-type semiconductor 121 is formed is set to be the same as a concentration X1 of impurities when the N-type semiconductor 110 is formed, or to be lower than the concentration X1 of impurities when the N-type semiconductor 110 is formed (X2≤X1).

An N-type semiconductor is formed in each of the semiconductor substrates to satisfy these conditions, and thereby, when the N-type semiconductor 110 formed in the first semiconductor substrate 11 is compared with the N-type semiconductor 121 formed in the second semiconductor substrate 12, a depletion layer of the N-type semiconductor 121 is formed at a position deeper than a position of a depletion layer of the N-type semiconductor 110 in the solid-state imaging device 10.

In addition, in the solid-state imaging device 10, a silicon oxide film 131 which is an insulation film and a polysilicon gate electrode 132 which is a conductive layer are formed on a surface of a position at which the N-type semiconductor 121 is formed in the second semiconductor substrate 12. The silicon oxide film 131 and the silicon polysilicon gate electrode 132 formed in the solid-state imaging device 10 are an oxide film and a metal electrode, respectively, having a characteristic of transmitting near infrared light without shielding it.

In a configuration of the solid-state imaging device 10 shown in FIG. 1, the silicon oxide film 131 which is an insulation film and the polysilicon gate electrode 132 which is a conductive layer are formed as an oxide film and a metal electrode in the second semiconductor substrate 12. However, an insulation film and a conductive layer formed in the solid-state device 10 are not limited to the silicon oxide film 131 and the polysilicon gate electrode 132. In other words, as long as an insulation film and a conductive layer are able to realize a characteristic and a function of transmitting near infrared light without shielding it in the same manner as the silicon oxide film 131 and the polysilicon gate electrode 132, a combination of the insulation film (oxide film) and the conductive layer (metal electrode) formed of other materials may also be formed in the solid-state imaging device 10.

In the second semiconductor substrate 12, a photogate type photoelectric conversion unit (photodiode) 101 is configured by the polysilicon gate electrode 132 and the N-type semiconductor 121, and a PN junction type photoelectric conversion unit (photodiode) 102 is configured by a PN junction of the p-type semiconductor 120 and the N-type semiconductor 121. In the solid-state imaging device 10, the PN junction type photoelectric conversion unit 102 is a photoelectric conversion unit (photodiode) of a near infrared light detection pixel. In FIG. 1, each of the photogate type photoelectric conversion unit 101 and the PN junction type photoelectric conversion unit 102 (photoelectric conversion unit of a near infrared light detection pixel) configured in the second semiconductor substrate 12 is schematically indicated by a diode symbol.

Moreover, in the solid-state imaging device 10, a gate voltage VG is applied to the polysilicon gate electrode 132. By applying this gate voltage VG the depletion layer 103 of the photoelectric conversion unit 102 is positioned deeper in the second semiconductor substrate 12 than when the gate voltage VG is not applied. Accordingly, a wavelength of near infrared light detected by the photoelectric conversion unit 102 when the gate voltage VG is applied is longer than a wavelength of near infrared light detected when the gate voltage VG is not applied. FIG. 1 schematically shows a state in which the depletion layer 103 of the photoelectric conversion unit 102 is positioned at a deeper position indicated by a dashed line due to the gate voltage VG applied to the polysilicon gate electrode 132.

It is possible to control a depth of the depletion layer 103 of the photoelectric conversion unit 102 by controlling the voltage value of the gate voltage VG. In other words, it is possible to control the wavelength of the near infrared light detected by the photoelectric conversion unit 102 by controlling the voltage value of the gate voltage VG.

According to the first embodiment, a solid-sate imaging device (the solid-state imaging device 10) is configured to include a first semiconductor substrate (the first semiconductor substrate 11) in which a first photoelectric conversion layer (the photoelectric conversion unit of a visible light detection pixel) for photoelectrically converting incident light in a first wavelength band (visible light) is formed in a two-dimensional matrix shape, a second semiconductor substrate (the second semiconductor substrate 12) in which a second photoelectric conversion layer (the photoelectric conversion unit 102 of a near infrared light detection pixel) for photoelectrically converting incident light is formed in a two-dimensional matrix shape, a conductive layer (the polysilicon gate electrode 132) which is disposed between the first semiconductor substrate 11 and the second semiconductor substrate 12, and has conductivity corresponding to the photoelectric conversion unit 102 of a near infrared light detection pixel, and an insulation film (the silicon oxide film 131) which is disposed between the second semiconductor substrate 12 and the polysilicon gate electrode 132, and has an insulation property corresponding to the photoelectric conversion unit 102 of a near infrared light detection pixel. The solid-state imaging device is also configured so that light passing through the photoelectric conversion unit of a visible light detection pixel, the polysilicon gate electrode 132, and the silicon oxide film 131 is incident on the second semiconductor substrate 12, a predetermined voltage (gate voltage VG) is applied to the polysilicon gate electrode 132, and a wavelength of light in a second wavelength band (near infrared light) which is photoelectrically converted by the photoelectric conversion unit 102 of a near infrared light detection pixel when the gate voltage VG is applied to the polysilicon gate electrode 132 is even longer than a wavelength of light in a wavelength band which is photoelectrically converted by the photoelectric conversion unit 102 of a near infrared light detection pixel when the gate voltage VG is not applied to the polysilicon gate electrode 132.

In addition, according to the first embodiment, the solid-state imaging device 10 is configured so that the photoelectric conversion unit of a visible light detection pixel and the photoelectric conversion unit 102 of a near infrared light detection pixel form a PN junction type photoelectric conversion unit (photodiode), the thickness of a first N-type semiconductor layer (the N-type semiconductor 110) which forms the photoelectric conversion unit of a visible light detection pixel is even thinner than the thickness of a second N-type semiconductor layer (the N-type semiconductor 121) which forms the photoelectric conversion unit 102 of a near infrared light detection pixel.

Moreover, according to the first embodiment, the solid-state imaging device 10 is configured so that a concentration of impurities when the N-type semiconductor 110 is formed is the same as a concentration of impurities when the N-type semiconductor 121 is formed, or is higher than the concentration of impurities when the N-type semiconductor 121 is formed.

With such a configuration, the solid-state imaging device 10 detects visible light by the photoelectric conversion unit of a visible light detection pixel formed in the first semiconductor substrate 11, and detects near infrared light by the photoelectric conversion unit 102 of a near infrared light detection pixel formed in the second semiconductor substrate 12. Here, the photoelectric conversion unit 101 shown in FIG. 1 functions as a pixel which detects (absorbs) slight visible light that has passed through the first semiconductor substrate 11. In other words, the photoelectric conversion unit 101 functions as a configuration (pixel) which absorbs and suppresses visible light that passes through the first semiconductor substrate 11 along with near infrared light without being detected (not absorbed) by the photoelectric conversion unit of a visible light detection pixel and is likely to leak into the near infrared light detected by the photoelectric conversion unit 102. With such a configuration, the solid-state imaging device 10 is able to separate visible light and near infrared light with high accuracy, detect the visible light by the photoelectric conversion unit of a visible light detection pixel, and detect only the near infrared light by the photoelectric conversion unit 102 of a near infrared light detection pixel.

An electric signal (pixel signal) obtained by photoelectrically converting the visible light that has been detected by the photoelectric conversion unit 101 and has slightly passed through the first semiconductor substrate 11 may be discarded.

In addition, the solid-state imaging device 10 shown in FIG. 1 shows a configuration of a case in which one N-type semiconductor 121 (that is, one near infrared light detection pixel) is formed with respect to three N-type semiconductors 110 formed in the first semiconductor substrate 11 (that is, three visible light detection pixels (actually, it is desirable to have four visible light detection pixels vertically and horizontally adjacent to each other, which are handled as one set in a general solid-state imaging device)). However, the near infrared light detection pixel may also be configured to be formed to correspond to each of the visible light detection pixels (that is, one near infrared light detection pixel is formed with respect to one visible light detection pixel). In this case, the pixel signal obtained by detecting and photoelectrically converting visible light by the photoelectric conversion unit 101 corresponding to each near infrared light detection pixel may be configured not to be discarded but to be used as a part of a pixel signal obtained by photoelectrically converting visible light by a corresponding visible light detection pixel.

In the solid-state imaging device 10, a color filter (color filter) according to a wavelength (color) of visible light detected by each visible light detection pixel is able to be affixed. Accordingly, the solid-state imaging device 10 is able to acquire a visible light image in color, and a near infrared image. In other words, the configuration of the solid-state imaging device 10 shown in FIG. 1 is a configuration in which a visible light image in monochrome and a near infrared image are acquired, but the visible light image in color and the near infrared image is able to also be acquired with the same configuration.

Second Embodiment

Figure 2:
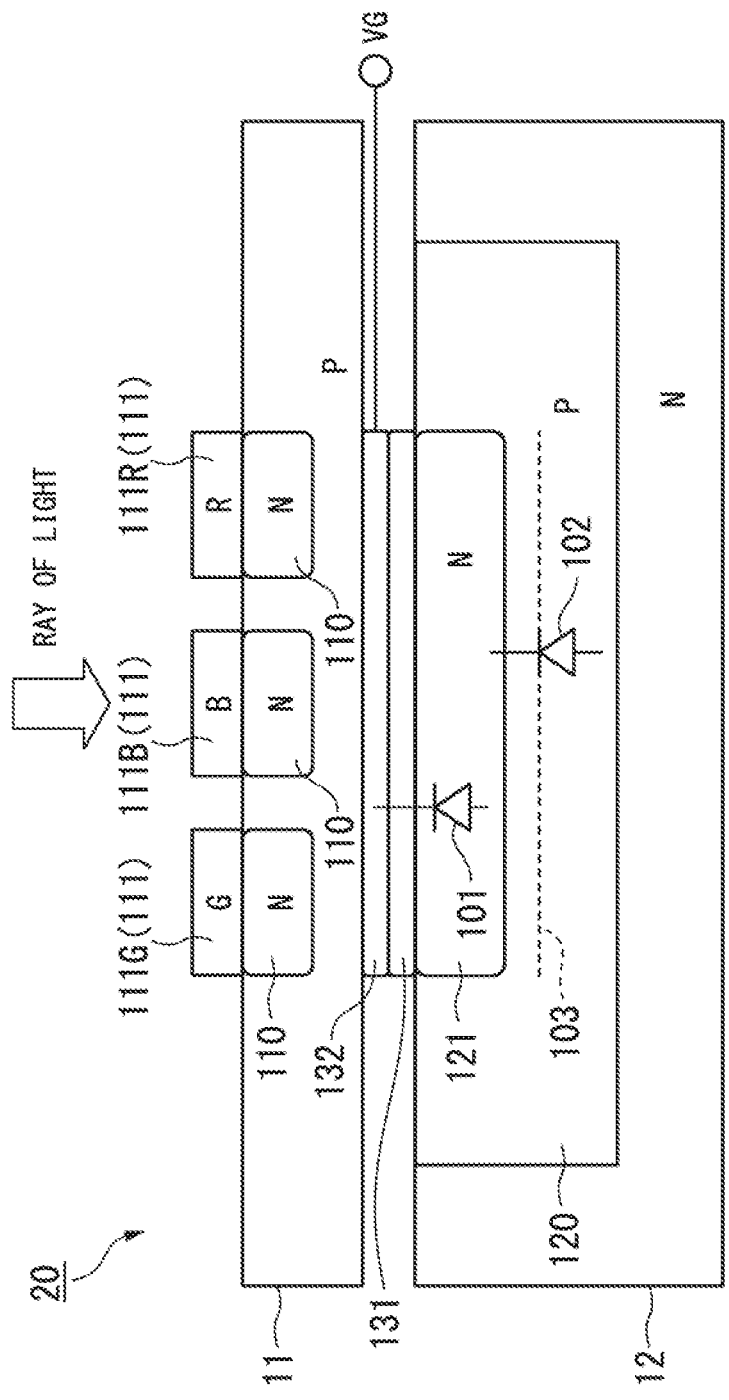
FIG. 2 is a diagram which shows a schematic structure of a solid-state imaging device according to a second embodiment of the present invention.

Next, a solid-state imaging device according to a second embodiment of the present invention will be described. FIG. 2 is a diagram which shows a schematic structure of the solid-state imaging device according to the second embodiment of the present invention. A solid-state imaging device 20 of the second embodiment is configured to have a color filter 111 affixed to the solid-state imaging device 10 of the first embodiment. FIG. 2 also shows the schematic structure as a vertical structure of a portion of a pixel array portion formed in the solid-state imaging device 20 as seen from a side surface. In the following description, only differences between the solid-state imaging device 20 and the solid-state imaging device 10 of the first embodiment will be described, and the same configurations as the solid-state imaging device 10 of the first embodiment will be given the same reference numerals and a detailed description thereof will be omitted.

The solid-state imaging device 20 of the second embodiment, like the solid-state imaging device 10 of the first embodiment, is also a solid-state imaging device which is able to acquire a visible light image and a near infrared light image. However, in the solid-state imaging device 20, color filters 111 transmitting visible light of wavelengths (color) detected by respective visible light detection pixels are affixed to positions of photoelectric conversion units of respective visible light detection pixels formed in the first semiconductor substrate 11 (N-type semiconductors 110 formed in the first semiconductor substrate 11). Therefore, the solid-state imaging device 20 is able to acquire visible light images in color and near infrared images.

The color filters 111 affixed to the positions of respective visible light detection pixels of the solid-state imaging device 20 have a characteristic of transmitting both visible light and near infrared light of a corresponding wavelength (color). FIG. 2 shows a case in which each color filter among a color filter 111G transmitting both visible light and near infrared light of a wavelength corresponding to green (G), a color filter 111B transmitting both visible light and near infrared light of a wavelength corresponding to blue (B), and a color filter 111R transmitting both visible light and near infrared light of a wavelength corresponding to red (R) is affixed to a position of a corresponding visible light detection pixel.

According to the second embodiment, a solid-state imaging device (the solid-state imaging device 20) is configured so that a first photoelectric conversion layer (the photoelectric conversion unit of a visible light detection pixel) has any one color filter (color filter 111) among a first color filter (color filter 111R) transmitting red wavelength light, a second color filter (color filter 111G) transmitting green wavelength light, and a third color filter (color filter 111B) transmitting blue wavelength light disposed on a side on which light in the first wavelength band (visible light) is incident, and each of the color filter 111R, the color filter 111G, and the color filter 111B further transmit at least light in the second wavelength band (near infrared light).

With such a configuration, in the solid-state imaging device 20, only green visible light is detected by a photoelectric conversion unit of a visible light detection pixel to which the color filter 111G is affixed, only blue visible light is detected by a photoelectric conversion unit of a visible light detection pixel to which the color filter 111B is affixed, and only red visible light is detected by a photoelectric conversion unit of a visible light detection pixel to which the color filter 111R is affixed. In addition, the solid-state imaging device 20 detects near infrared light that has passed through respective visible light detection pixels to which the color filter 111G, the color filter 111B, and the color filter 111R are affixed by the photoelectric conversion unit 102 of a near infrared light detection pixel formed in the second semiconductor substrate 12. Then, in the solid-state imaging device 20, the photoelectric conversion unit 101 functions as a pixel which detects (absorbs) and suppresses slight visible light of green (G), blue (B), and red (R) that has passed through the first semiconductor substrate 11 along with the near infrared light without being detected (absorbed) by the photoelectric conversion unit of each visible light detection pixel. With such a configuration, the solid-state imaging device 20 is able to separate visible light and near infrared light of each wavelength (color) with high accuracy, detect the visible light of each wavelength (color) by the photoelectric conversion unit of a visible light detection pixel, and detect only the near infrared light by the photoelectric conversion unit 102 of near infrared light.

Third Embodiment

Figure 3:
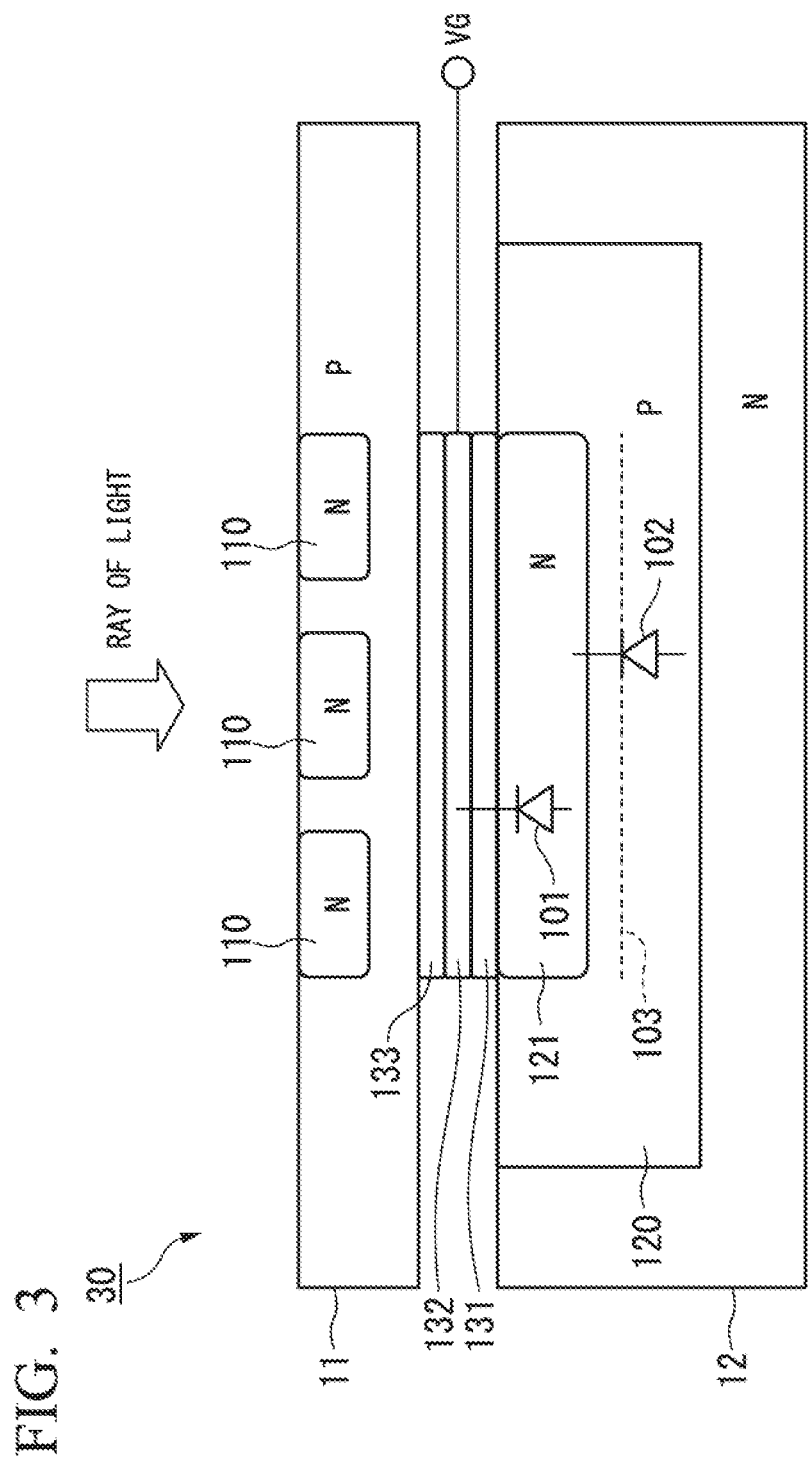
FIG. 3 is a diagram which shows a schematic structure of a solid-state imaging device according to a third embodiment of the present invention.

Next, a solid-state imaging device according to a third embodiment of the present invention will be described. FIG. 3 is a diagram which shows a schematic structure of the solid-state imaging device according to the third embodiment of the present invention. A solid-state imaging device 30 of the third embodiment, like the solid-state imaging device 10 of the first embodiment, is also configured by stacking a plurality of semiconductor substrates. FIG. 3, like the solid-state imaging device 10 of the first embodiment, in the solid-state imaging device 30 of a configuration in which the first semiconductor substrate 11 and the second semiconductor substrate 12 are stacked (joined), also shows the schematic structure as a vertical structure of a portion of a pixel array portion formed in the solid-state imaging device 30 as seen from a side surface.

A configuration of the first semiconductor substrate 11 and the second semiconductor substrate 12 configuring the solid-state imaging device 30 includes the same configuration elements as the configuration of the first semiconductor substrate 11 and the second semiconductor substrate 12 in the solid-state imaging device 10 according to the first embodiment. Accordingly, in the following description, only differences between the solid-state imaging device 30 and the solid-state imaging device 10 of the first embodiment will be described, and the same configurations as the solid-state imaging device 10 of the first embodiment will be given the same reference numerals and a detailed description thereof will be omitted.

The solid-state imaging device 30 of the third embodiment, like the solid-state imaging device 10 of the first embodiment, is also a solid-state imaging device which is able to acquire a visible light image and a near infrared light image. However, in the solid-state imaging device 30, a silicon oxide film 133 is formed between the first semiconductor substrate 11 and the polysilicon gate electrode 132 formed in the second semiconductor substrate 12. This silicon oxide film 133 functions as an anti-reflection film which prevents reflection of light at an interface with the first semiconductor substrate 11 on a side from which visible light and near infrared light that have passed through the photoelectric conversion unit of a visible light detection pixel are emitted. As a result, all of the visible light and the near infrared light that have passed through the first semiconductor substrate 11 are incident on the second semiconductor substrate 12. The silicon oxide film 131 also functions as an anti-reflection film which prevents reflection of light at an interface with the second semiconductor substrate 12 on a side on which the visible light and the near infrared light that have passed through the first semiconductor substrate 11 are incident. That is, the solid-state imaging device 30 prevents reflection of light between the first semiconductor substrate 11 and the second semiconductor substrate 12 by a multi-layer structure of the silicon oxide film 131, the polysilicon gate electrode 132, and the silicon oxide film 133.

According to the third embodiment, a solid-state imaging device (the solid-state imaging device 30) is configured to further include an anti-reflection film (the silicon oxide film 133) which is disposed between a first semiconductor substrate (the first semiconductor substrate 11) and a conductive layer (the polysilicon gate electrode 132) and prevents reflection of light that has passed through a first photoelectric conversion layer (the photoelectric conversion layer of a visible light detection pixel).

With such a configuration, the solid-state imaging device 30, like the solid-state imaging device 10 of the first embodiment, detects visible light by the photoelectric conversion unit of a visible light detection pixel formed in the first semiconductor substrate 11, and detects only near infrared light by the photoelectric conversion unit 102 of a near infrared light detection pixel formed in the second semiconductor substrate 12. At this time, the silicon oxide film 133 is formed in the solid-state imaging device 30, and thereby an anti-reflection film is configured between the first semiconductor substrate 11 and the second semiconductor substrate 12 in a multi-layer structure of the silicon oxide film 131, the polysilicon gate electrode 132, and the silicon oxide film 133. With such a configuration, in the solid-state imaging device 30, more visible light and near infrared light is able to pass through the second semiconductor substrate 12 than in the solid-state image device 10 of the first embodiment, and more near infrared light is able to be detected by the photoelectric conversion unit 102 of a near infrared light detection pixel.

Fourth Embodiment

Figure 4:
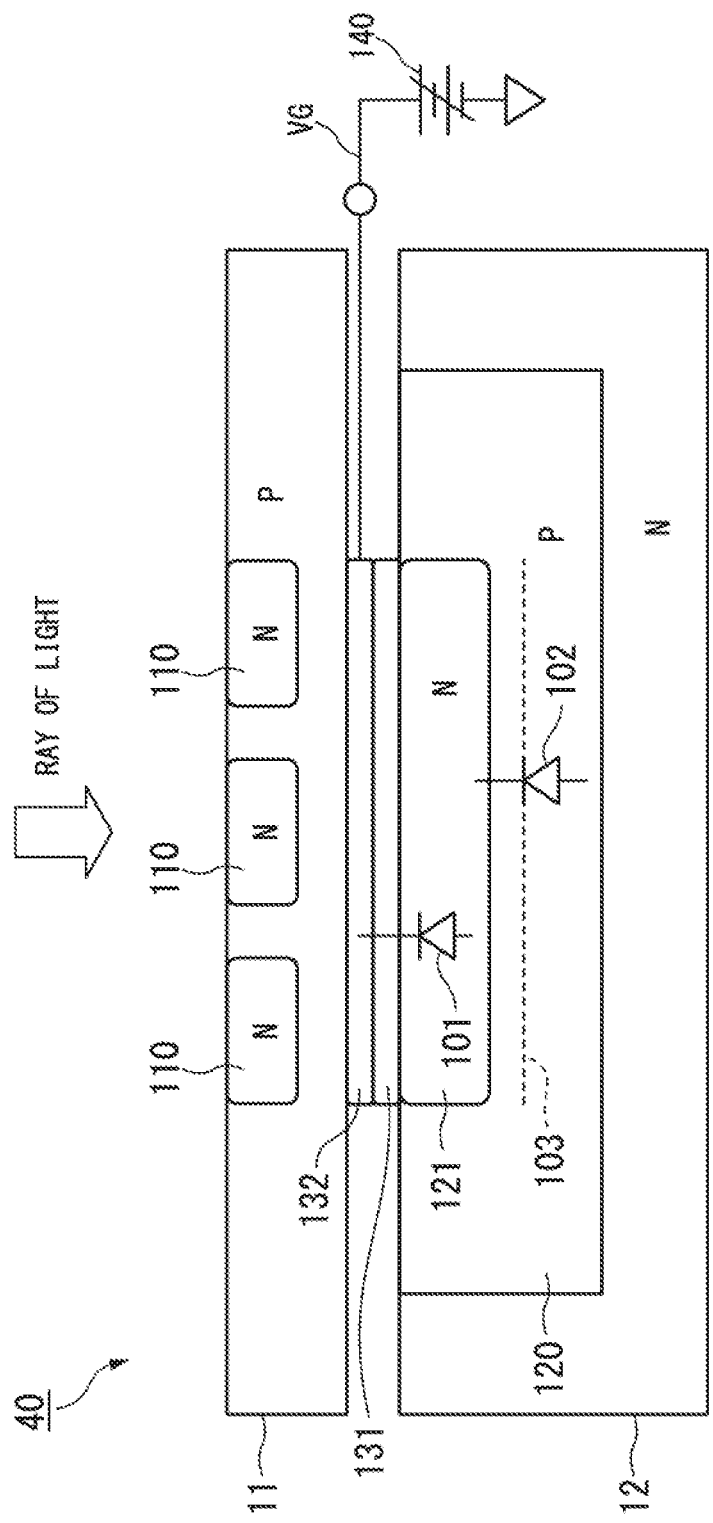
FIG. 4 is a diagram which shows a schematic structure of a solid-state imaging device according to a fourth embodiment of the present invention.

Next, a solid-state imaging device according to a fourth embodiment of the present invention will be described. FIG. 4 is a diagram which shows a schematic structure of the solid-state imaging device according to the fourth embodiment of the present invention. The solid-state imaging device 40 of the fourth embodiment is configured so that a voltage value of the gate voltage VG applied to the polysilicon gate electrode 132 in the solid-state imaging device 10 of the first embodiment is variable. FIG. 4 also shows the schematic structure as a vertical structure of a portion of a pixel array portion formed in the solid-state imaging device 40 as seen from a side surface. In the following description, only differences between the solid-state imaging device 40 and the solid-state imaging device 10 of the first embodiment will be described, and the same configurations as the solid-state imaging device 10 of the first embodiment will be given the same reference numerals and a detailed description thereof will be omitted.

The solid-state imaging device 40 of the fourth embodiment, like the solid-state imaging device 10 of the first embodiment, is also a solid-state imaging device which is able to acquire a visible light image and a near infrared light image. The solid-state imaging device 40 includes a gate voltage control unit 140 which changes the voltage value of the gate voltage VG applied to the polysilicon gate electrode 132 formed at a position in which the N-type semiconductor 121 is formed in the second semiconductor substrate 12.

As described above, it is possible to control a depth of the depletion layer 103 of the photoelectric conversion unit 102 (that is, a length of the wavelength of the near infrared light detected by the photoelectric conversion unit 102) by controlling a voltage value of the gate voltage VG. In the solid-state imaging device 40, it is possible to control a depth of the depletion layer 103 of the photoelectric conversion unit 102 which is schematically indicated by a dashed line in FIG. 4 to become a depth according to the wavelength of near infrared light to be detected by the photoelectric conversion unit 102 by changing a voltage value of the gate voltage VG output by the gate voltage control unit 140. More specifically, in the solid-state imaging device 40, it is possible to control a position of the depletion layer 103 to move to a position deeper than a current position and the photoelectric conversion unit 102 to detect near infrared light of a longer wavelength by setting a voltage value of the gate voltage VG to be higher than a current voltage value. On the other hand, in the solid-state imaging device 40, it is possible to control a position of the depletion layer 103 to move to a position shallower than a current position and the photoelectric conversion unit 102 to detect near infrared light of a shorter wavelength by setting a voltage value of the gate voltage VG to be lower than a current voltage value.

In the present invention, a method of changing a voltage value of the gate voltage VG output by the gate voltage control unit 140 is not particularly specified. For example, the solid-state imaging device 40 may also be configured so that the gate voltage control unit 140 is included in the second semiconductor substrate 12 (may be included in the first semiconductor substrate 11), and the gate voltage control unit 140 generates the gate voltage VG with the voltage value set according to control from an external control unit of the solid-state imaging device 40 (that is, a voltage value of the gate voltage VG is changed (controlled) according to control from an external control unit). Moreover, for example, the solid-state imaging device 40 may also be configured so that a voltage value of the gate voltage VG generated outside the solid-state imaging device 40 is directly input.

With such a configuration, the solid-state imaging device 40, like the solid-state imaging device 10 of the first embodiment, detects visible light by the photoelectric conversion unit of a visible light detection pixel formed in the first semiconductor substrate 11, and detects only near infrared light by the photoelectric conversion unit 102 of a near infrared light detection pixel formed in the second semiconductor substrate 12. At this time, the solid-state imaging device 40 changes a voltage value of the gate voltage VG applied to the polysilicon gate electrode 132 by the gate voltage control unit 140. Accordingly, the solid-state imaging device 40 is able to acquire a near infrared light image obtained by detecting near infrared light of a desired wavelength.

The solid-state imaging device 40 is configured so that a voltage value of the gate voltage VG applied to the polysilicon gate electrode 132 is set to be the same value for all near infrared light detection pixels (that is, near infrared light of the same wavelength is detected by the photoelectric conversion units 102 of all near infrared light detection pixels). However, the solid-state imaging device 40 may also be configured so that the gate voltage VG with a different voltage value is applied for each near infrared light pixel or for each set of predetermined near infrared light detection pixels. That is, the solid-state imaging device 40 may also be configured so that the gate voltage VG with a different voltage value is applied for each polysilicon gate electrode 132 or for each set of predetermined polysilicon gate electrodes 132. As a result, the solid-state imaging device 40 is able to detect near infrared light of a different wavelength for each near infrared light pixel or for each set of predetermined near infrared light detection pixels.

Figure 5:
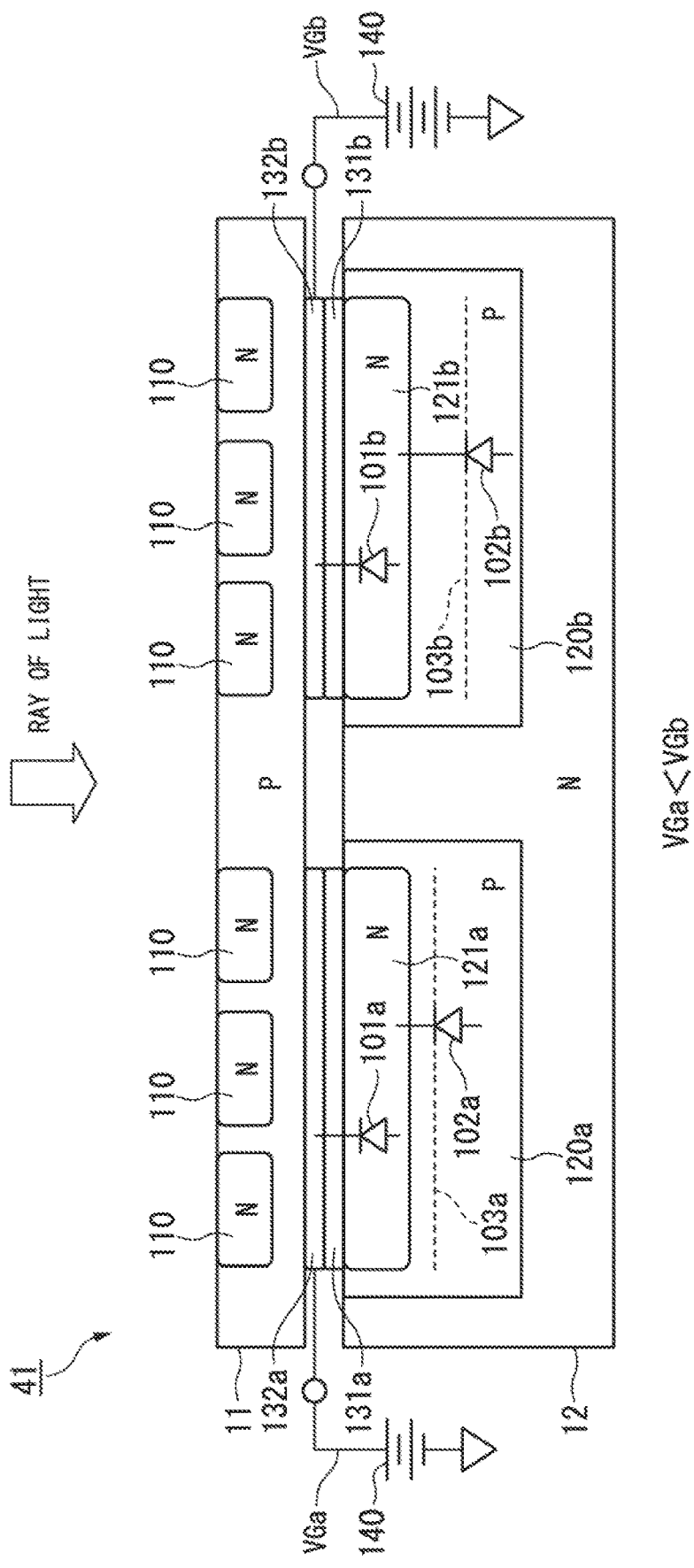
FIG. 5 is a diagram which shows a schematic structure of a modified example of the solid-state imaging device according to the fourth embodiment of the present invention.

Here, an example of a configuration in which the gate voltage VG with a different voltage value is applied to each near infrared light pixel in the solid-state imaging device 40 will be described. FIG. 5 is a diagram which shows a schematic structure of a modified example of the solid-state imaging device of the fourth embodiment of the present invention. FIG. 5 also shows the schematic structure of the modified example of the solid-state imaging device 40 of the fourth embodiment as a vertical structure of a portion of a pixel array portion as seen from a side surface. In the following description, the solid-state imaging device 40 of the modified example of the fourth embodiment shown in FIG. 5 is referred to as a "solid-state imaging device 41".

FIG. 5 shows an example of a configuration in which the gate voltage VG with a different voltage value is applied for each near infrared light detection pixel corresponding to a set of visible light detection pixels including three N-type semiconductors 110 formed in the first semiconductor substrate 11 (that is, three visible light detection pixels (actually, it is desirable that there be four visible light detection pixels vertically and horizontally adjacent to each other, which are handled as one set in a general solid-state imaging device)). In FIG. 5, a near infrared light detection pixel corresponding to one set of visible light detection pixels is indicated as "near infrared light detection pixel a", and a near infrared light detection pixel corresponding to the other set of visible light detection pixels is indicated as "near infrared light detection pixel b". Then, in FIG. 5, a reference numeral "a" or a reference numeral "b" for distinguishing corresponding near infrared light detection pixels is added to a reference numeral for a configuration corresponding to each near infrared light pixel for an indication.

In the solid-state imaging device 41, a gate voltage VGa is applied to a polysilicon gate electrode 132a corresponding to a near infrared light detection pixel a and a gate voltage VGb is applied to a polysilicon gate electrode 132b corresponding to a near infrared light detection pixel b. Here, a voltage value of a gate voltage VGa is considered to be lower than a voltage value of a gate voltage VGb (that is, VGa<VGb). In this case, as shown in FIG. 5, a position of a depletion layer 103b is deeper than a position of a depletion layer 103a. Accordingly, a photoelectric conversion unit 102b of the near infrared light detection pixel b detects near infrared light of a longer wavelength than the photoelectric conversion unit 102a of the near infrared light detection pixel a. As a result, the solid-state imaging device 41 is able to acquire two near infrared light images including a near infrared light image of a wavelength detected by the photoelectric conversion unit 102a of the near infrared light detection pixel a, and a near infrared light image of a wavelength detected by the photoelectric conversion unit 102b of the near infrared light detection pixel b.

According to the fourth embodiment, a solid-state imaging device (the solid-state imaging device 40) is configured to further include a gate voltage control unit (the gate voltage control unit 140) for controlling a predetermined voltage (the gate voltage VG) applied to a conductive layer (the polysilicon gate electrode 132).

In addition, according to the fourth embodiment, the solid-state imaging device 40 is configured so that the gate voltage control unit 140 controls the gate voltage VG to be a different voltage value for each polysilicon gate electrode 132, or for each of the plurality of polysilicon gate electrodes 132 corresponding to a second photoelectric conversion layer (the photoelectric conversion unit 102 of a near infrared light detection pixel).

As described above, in the solid-state imaging device according to the first to fourth embodiments of the present invention, the photoelectric conversion unit of a visible light detection pixel for detecting visible light is configured by forming the N-type semiconductor 110 in the first semiconductor substrate 11, and the photoelectric conversion unit 102 of a near infrared light detection pixel for detecting near infrared light is configured by forming an NPN semiconductor structure, the silicon oxide film 131, and the polysilicon gate electrode 132 in the second semiconductor substrate 12. In addition, in the solid-state imaging devices according to the first to fourth embodiments of the present invention, the photogate type photoelectric conversion unit 101 is configured by the polysilicon gate electrode 132, and the N-type semiconductor 121 formed in the second semiconductor substrate 12. Then, in the solid-state imaging device according to the first to fourth embodiments of the present invention, slight visible light that has passed through the first semiconductor substrate 11 is detected and suppressed by the photoelectric conversion unit 101. Accordingly, the solid-state imaging device according to the first to fourth embodiments of the present invention are able to separate visible light and near infrared light with high accuracy, detect the visible light by the photoelectric conversion unit of a visible light detection pixel, and detect only the near infrared light by the photoelectric conversion unit 102 of a near infrared light detection pixel. Then, an imaging system (imaging application) equipped with the solid-state imaging device according to the first to fourth embodiments of the present invention is able to acquire both a visible light image and a near infrared light image at the same time and execute processing using each image.

The imaging system (imaging application) equipped with the solid-state imaging device detects near infrared light of a specific wavelength such as near infrared light of 850 nm or 940 nm which is emitted by near infrared light illumination (for example, LED illumination) in some cases. The solid-state imaging device mounted in the imaging system (imaging application) desirably includes a configuration for detecting near infrared light of a desired wavelength.

Fifth Embodiment

Figure 6:
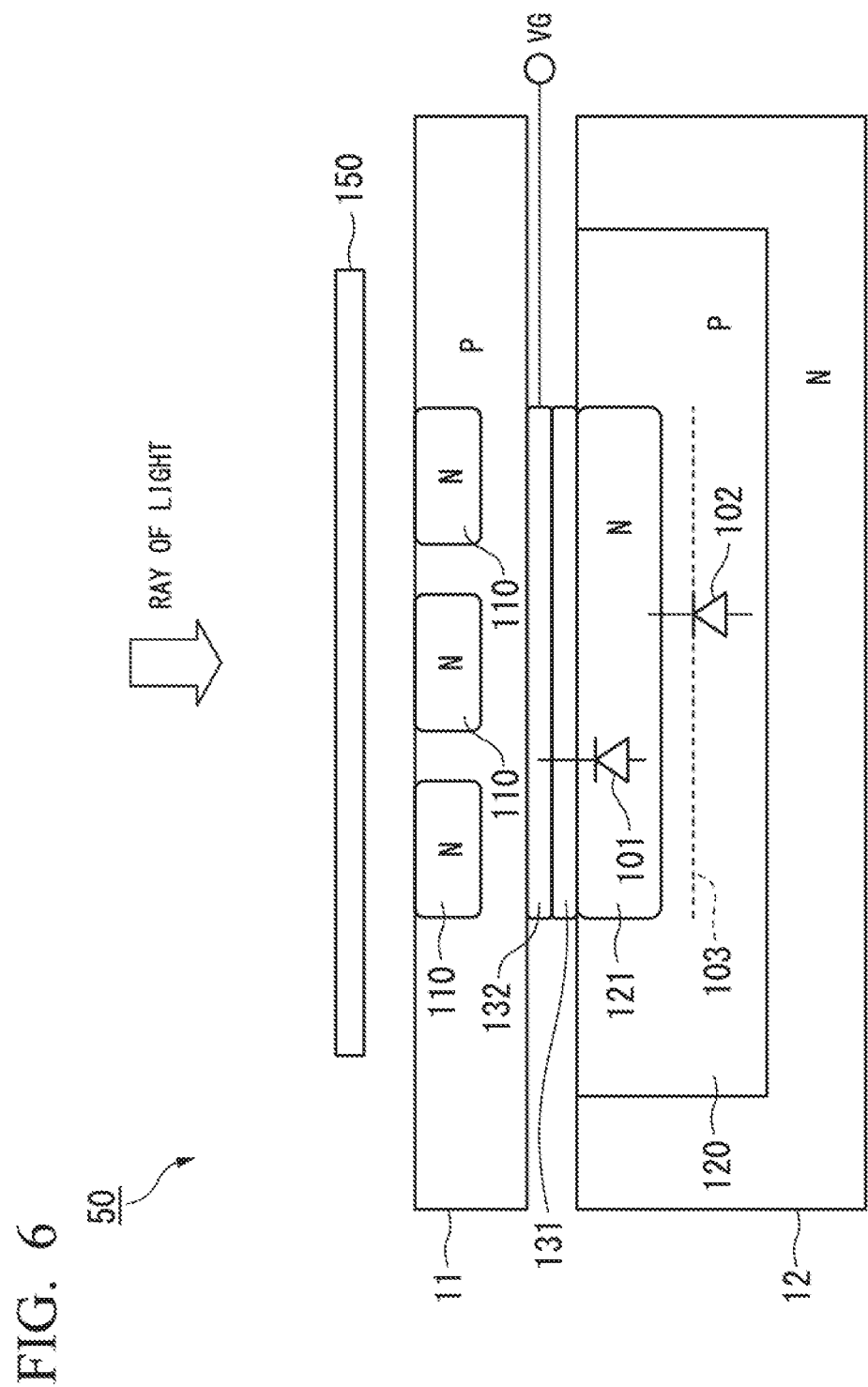
FIG. 6 is a diagram which shows a schematic structure of a solid-state imaging device according to a fifth embodiment of the present invention.

Next, a solid-state imaging device according to a fifth embodiment of the present invention will be described. FIG. 6 is a diagram which shows a schematic structure of the solid-state imaging device according to the fifth embodiment of the present invention. A solid-state imaging device 50 of the fifth embodiment is a solid-state imaging device which detects visible light and near infrared light of a specific wavelength by including an optical filter 150 in the solid-state imaging device 10 of the first embodiment. FIG. 6 also shows the schematic structure as a vertical structure of a portion of a pixel array portion formed in the solid-state imaging device 50 as seen from a side surface. In the following description, only differences between the solid-state imaging device 50 and the solid-state imaging device 10 of the first embodiment will be described, and the same configurations as the solid-state imaging device 10 of the first embodiment will be given the same reference numerals and a detailed description thereof will be omitted.

The optical filter 150 has a characteristic of shielding (absorbing or reflecting) only light of a predetermined wavelength in light (rays of light) incident on the solid-state imaging device 50. More specifically, the optical filter 150 has a characteristic of shielding light from near infrared light of a predetermined wavelength equal to or greater than an upper limit wavelength that is able to be detected by a visible light detection pixel included in the solid-state imaging device 50 to visible light of a predetermined wavelength equal to or less than a lower limit wavelength that is able to be detected by a near infrared light detection pixel. In other words, a light transmission characteristic of the optical filter 150 is a characteristic of transmitting both near infrared light of a predetermined wavelength longer than the upper limit wavelength that is able to be detected by the visible light detection pixel included in the solid-state imaging device 50 and visible light of a predetermined wavelength shorter than the lower limit wavelength that is able to be detected by the near infrared light detection pixel. The upper limit wavelength of the visible light and the lower limit wavelength of the near infrared light, which are transmitted by the optical filter 150, are determined according to spectral sensitivity of the photoelectric conversion unit of a visible light detection pixel and spectral sensitivity of the photoelectric conversion unit 102 of a near infrared light detection pixel, which are formed in the solid-state imaging device 50.

Figure 7:
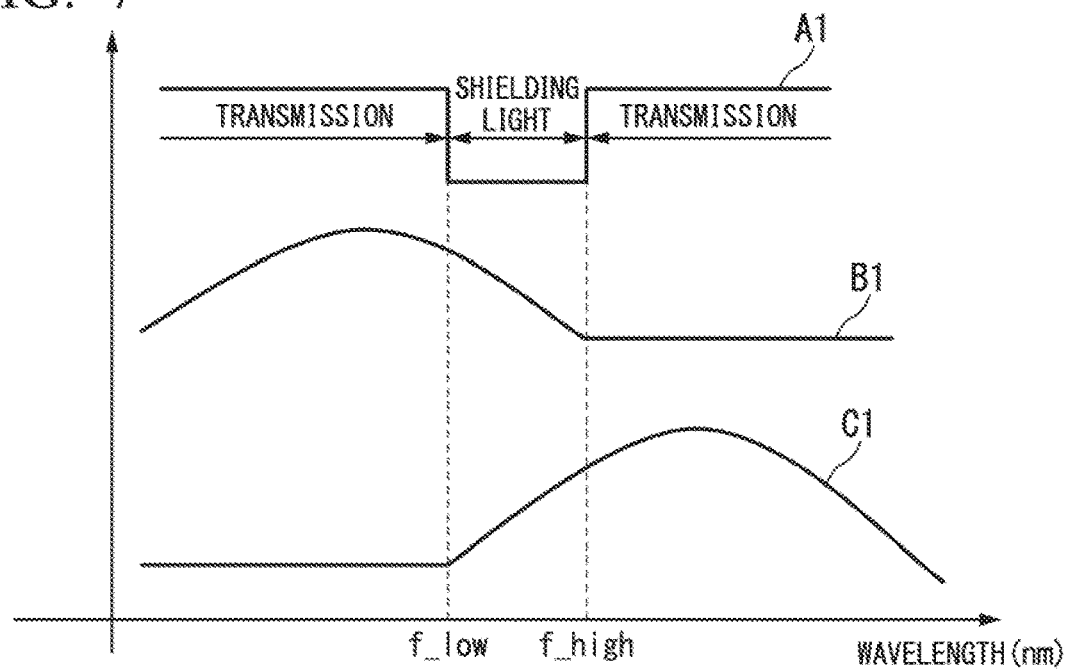
FIG. 7 is a diagram which describes transmission characteristics of an optical filter provided in the solid-state imaging device according to the fifth embodiment of the present invention.

Here, a relationship between the transmission characteristic of the optical filter 150 and the spectral sensitivity of a visible light detection pixel and a near infrared light detection pixel will be described. FIG. 7 is a diagram which describes the transmission characteristics of the optical filter 150 provided in the solid-state imaging device 50 according to the fifth embodiment of the present invention. FIG. 7, with a wavelength of light as a horizontal axis, shows an example of a light transmission characteristic A1 of the optical filter 150, a spectral sensitivity characteristic B1 of the photoelectric conversion unit of a visible light detection pixel, and a spectral sensitivity characteristic C1 of the photoelectric conversion unit 102 of a near infrared light detection pixel in respective graphs. A vertical axis in FIG. 7 represents a level of transmittance or sensitivity with respect to the wavelength of light shown by the horizontal axis, but in FIG. 7, respective graphs are shown separately for ease of description, and thus respective graphs do not represent an absolute level of transmittance or sensitivity.

When the spectral sensitivity characteristic of the photoelectric conversion unit of a visible light detection pixel is the spectral sensitivity characteristic B1 shown in FIG. 7, and the spectral sensitivity characteristic of the photoelectric conversion unit 102 of a near infrared light detection pixel is the spectral sensitivity characteristic C1 shown in FIG. 7, the light transmission characteristic of the optical filter 150 is set as the light transmission characteristic A1.

More specifically, when the sensitivity of the photoelectric conversion unit of a visible light detection pixel becomes zero from a wavelength f_high (for example, 800 nm), and the sensitivity is zero for wavelengths longer than the wavelength f_high, a lower limit wavelength of the near infrared light transmitted by the optical filter 150 is set to a wavelength equal to or greater than the wavelength f_high at which the sensitivity of the photoelectric conversion unit of a visible light detection pixel becomes zero. That is, a rising position in the graph of the light transmission characteristic A1 of the optical filter 150 shown in FIG. 7 is set to a position equal to or greater than the wavelength f_high.

Moreover, when the sensitivity of the photoelectric conversion unit 102 of a near infrared light detection pixel becomes zero from a wavelength f_low (for example, 700 nm), and the sensitivity is zero for wavelengths shorter than the wavelength f_low, an upper limit wavelength of the visible light transmitted by the optical filter 150 is set to a wavelength equal to or less than the wavelength f_low at which the sensitivity of the photoelectric conversion unit 102 of a near infrared light detection pixel becomes zero. That is, a falling position in the graph of the light transmission characteristic A1 of the optical filter 150 shown in FIG. 7 is set to a position equal to or less than the wavelength f_low.

In other words, the optical filter 150 sets the transmittance in at least a range of wavelengths at which both the photoelectric conversion unit of a visible light detection pixel and the photoelectric conversion unit 102 of a near infrared light detection pixel have sensitivity to light to be zero. That is, as shown in the light transmission characteristic A1 of the optical filter 150 shown in FIG. 7, at least light in a range from a wavelength longer than the wavelength f_low to a wavelength shorter than the wavelength f_high is shielded.

This light transmission characteristic A1 is able to be realized by setting the optical filter 150 as a so-called notch type (band illuminated type) optical filter.

In this manner, by setting the light transmission characteristic of the optical filter 150 as the light transmission characteristic A1, the solid-state imaging device 50 does not detect light (near infrared light) of a wavelength equal to or greater than the wavelength f_low by the photoelectric conversion unit of a visible light detection pixel and light (visible light) of a wavelength equal to or less than the wavelength f_high by the photoelectric conversion unit 102 of a near infrared light detection pixel, and thereby the solid-state imaging device 50 is able to separate visible light and near infrared light with higher accuracy and detect each type of light.

According to the fifth embodiment, a solid-state imaging device (the solid-state imaging device 50) has a configuration in which a first optical filter (the optical filter 150) which shields light from the predetermined first wavelength (the wavelength f_low (for example, 700 nm)) to the predetermined second wavelength (the wavelength f_high (for example, 800 nm)) longer than the wavelength f_low is further included, a first semiconductor substrate (the first semiconductor substrate 11) is disposed between the optical filter 150 and a second semiconductor substrate (the second semiconductor substrate 12), an upper limit wavelength in a first wavelength band (an upper limit wavelength of transmitted visible light) is a wavelength shorter than the wavelength f_low, and a lower limit wavelength in a second wavelength band (a lower limit wavelength of transmitted near infrared light) is a wavelength longer than the wavelength f_high.

As described above, the solid-state imaging device 50 includes the optical filter 150 whose transmission characteristic is determined on the basis of the spectral sensitivity characteristic B1 of the photoelectric conversion unit of a visible light detection pixel and the spectral sensitivity characteristic C1 of the photoelectric conversion unit 102 of a near infrared light detection pixel. With such a configuration, the solid-state imaging device 50 is able to separate visible light and near infrared light with high accuracy, detect the visible light by the photoelectric conversion unit of a visible light detection pixel, and detect only the near infrared light of a specific wavelength by the photoelectric conversion unit 102 of a near infrared light detection pixel.

For example, the solid-state imaging device 50 including the optical filter 150 with the light transmission characteristic A1 shown in FIG. 7, is able to separate visible light of a wavelength equal to or less than the wavelength f_low (for example, 700 nm) and near infrared light of a wavelength equal to or greater than the wavelength f_high (for example, 800 nm) with higher accuracy and detect light of each wavelength. As a result, the imaging system (imaging application) equipped with the solid-state imaging device 50 is able to realize a function of detecting near infrared light of a specific wavelength such as 850 nm or 940 nm emitted by near infrared light illumination (for example, LED illumination).

The upper limit wavelength of visible light and the lower limit wavelength of near infrared light, which are transmitted by the optical filter 150, as described above, are determined according to the spectral sensitivity of the photoelectric conversion unit of a visible light detection pixel and the spectral sensitivity of the photoelectric conversion unit 102 of a near infrared light detection pixel, which are formed in the solid-state imaging device 50, but they also need to be suitable for specifications in the imaging system (imaging application) equipped with the solid-state imaging device 50. Here, the specifications of the imaging system (imaging application) include a range of wavelengths of an acquired (photographed) image, a wavelength of light emitted by an illumination device (for example, LED illumination) included in the imaging system (imaging application), and the like.

Figure 8:
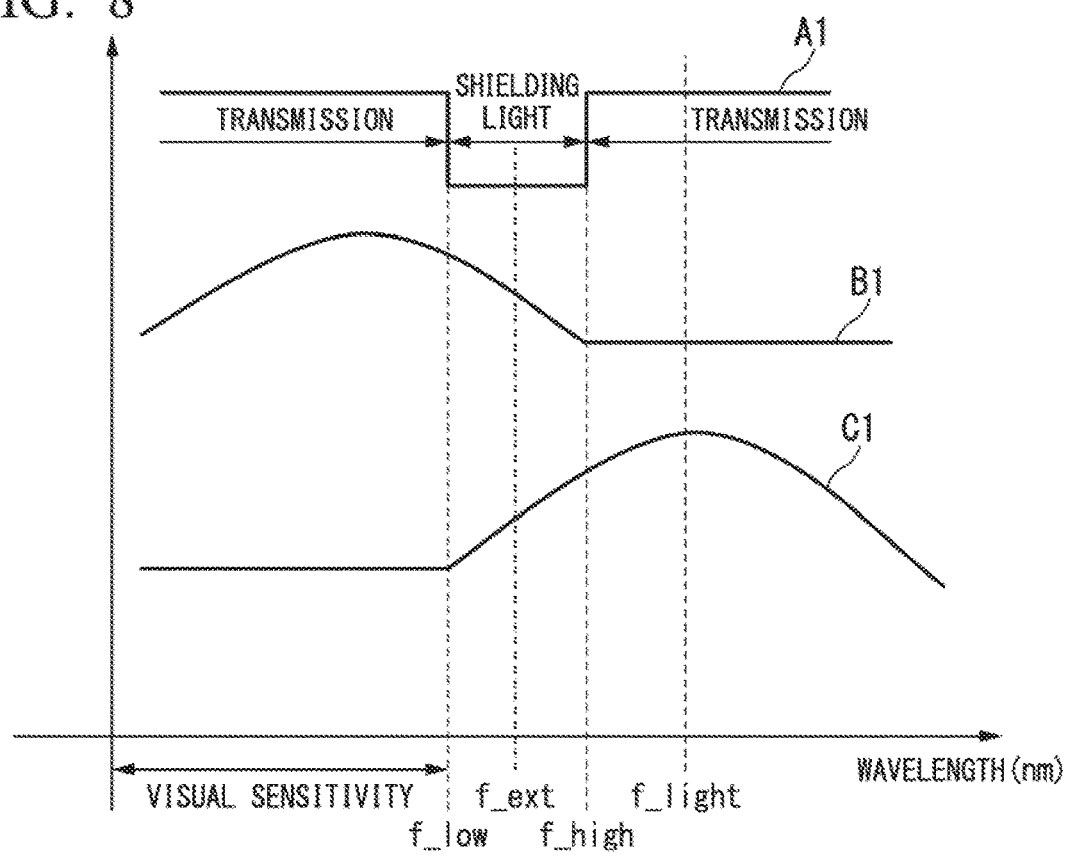
FIG. 8 is a diagram which describes a relationship between a transmission characteristic of the optical filter provided in the solid-state imaging device according to the fifth embodiment of the present invention and an imaging system.

Here, a relationship between the light transmission characteristic A1 of the optical filter 150 shown in FIG. 7 (that is, the upper limit wavelength of visible light and the lower limit wavelength of near infrared light which are transmitted by the optical filter 150), and a wavelength specification of the imaging system (imaging application) equipped with the solid-state imaging device 50 will be described with reference to several examples. FIG. 8 is a diagram which describes a relationship between the transmission characteristic of the optical filter 150 provided in the solid-state imaging device 50 according to the fifth embodiment of the present invention and the imaging system. FIG. 8 is a graph which shows the characteristics of the optical filter 150 shown in FIG. 7 and the wavelength specification of the imaging system to be described below. In the following description, the upper limit wavelength of the visible light transmitted by the optical filter 150 is set to the wavelength f_low=700 nm, and the lower limit wavelength of the near infrared light transmitted by the optical filter 150 is set to the wavelength f_high=800 nm. Moreover, a wavelength range of a visible light image acquired by the imaging system (that is, visual sensitivity to visible light) is set to be 400 nm to 700 nm in the following description.

First, a case in which the imaging system equipped with the solid-state imaging device 50 is a system which includes the near infrared light illumination (for example, LED illumination) and acquires information on a distance between the imaging system and an object based on a principle such as a so-called time of flight (TOF) method that measures time taken for near infrared light (pulsed light) emitted to a space of a photograph target to be reflected by the object and return or a triangulation method, or a monitoring camera including near infrared light illumination will be considered. In this case, it is desirable that the solid-state imaging device 50 detect a wavelength f_light of near infrared light emitted by the near infrared light illumination in addition to the wavelength range of a visible light image. For example, when the wavelength f_light of near infrared light emitted by the near infrared light illumination included in the imaging system is set to be 850 nm, it is checked whether the light transmission characteristic A1 of the optical filter 150 shown in FIG. 8 (FIG. 7) is suitable for the imaging system. The lower limit wavelength f_high of the near infrared light transmitted by the optical filter 150 is a wavelength shorter than the wavelength f_light of near infrared light emitted by the near infrared light illumination. In addition, the upper limit wavelength f_low of the visible light transmitted by the optical filter 150 matches an upper limit wavelength (=700 nm) of the visual sensitivity to visible light in the imaging system. For this reason, the solid-state imaging device 50 is able to acquire a normal visible light image by the photoelectric conversion unit of a visible light detection pixel, and acquire a near infrared light image (distance image) including information on a distance by the photoelectric conversion unit 102 of a near infrared light detection pixel. Accordingly, the light transmission characteristic A1 of the optical filter 150 shown in FIG. 8 is suitable for an imaging system such as a system or a monitoring camera which acquires information on the distance to an object.

Next, a case in which the imaging system equipped with the solid-state imaging device 50 is a medical system for simultaneously photographing a state contrast of blood vessels, subcutaneous tissue, brain tissue, and the like and a surface of a living body, or a security system for simultaneously photographing veins and a fingerprint will be considered. Such an imaging system also includes the near infrared light illumination. In this case, it is desirable that the solid-state imaging device 50 detect the wavelength f_light of near infrared light emitted by the near infrared light illumination in addition to the wavelength range of a visible light image. For example, when the wavelength f_light of near infrared light emitted by the near infrared light illumination included in the imaging system is set to be 940 nm or 1000 nm, it is checked whether the light transmission characteristic A1 of the optical filter 150 shown in FIG. 8 (FIG. 7) is suitable for the imaging system. The lower limit wavelength f_high of the near infrared light transmitted by the optical filter 150 is a wavelength shorter than the wavelength f_light of near infrared light emitted by the near infrared light illumination. Moreover, the upper limit wavelength f_low of the visible light transmitted by the optical filter 150 matches the upper limit wavelength (=700 nm) of the sensitivity to visible light in the imaging system. For this reason, the solid-state imaging device 50 is able to acquire a visible light image on the surface of a living body by the photoelectric conversion unit of a visible light detection pixel, and acquire a near infrared light image such as of blood vessels by the photoelectric conversion unit 102 of a near infrared light detection pixel. The wavelength of the near infrared light detected by the photoelectric conversion unit 102 of a near infrared light detection pixel, like in the solid-state imaging device 40 of the fourth embodiment and the solid-state imaging device 41 of the modified example which are shown in FIGS. 4 and 5, is able to changed by changing a voltage value of the gate voltage VG applied to the polysilicon gate electrode 132. Accordingly, the light transmission characteristic A1 of the optical filter 150 shown in FIG. 8 is suitable for an imaging system such as a medical system for contrasting blood vessels and the like, or a security system.

Next, a case in which the imaging system equipped with the solid-state imaging device 50 is a medical system which administers a fluorescent agent such as indocyanine green (ICG) and the like to a human body to diagnose cancer, and contrasts a specific protein that has emitted fluorescence by excitation due to near infrared light will be considered. Such an imaging system also includes near infrared light illumination, but it is desirable that the solid-state imaging device 50 not detect near infrared light emitted by the near infrared light illumination (that is, near infrared light (excitation light) for exciting a fluorescence agent), and detect only near infrared light of the specific protein which has emitted fluorescence. At this time, for example, when a wavelength f_ext of excitation light emitted by the near infrared light illumination included in the imaging system to excite the fluorescent agent is 770 nm, and a wavelength at which the specific protein has emitted fluorescence is 810 nm (in the following description, it is assumed to be "wavelength f_light"), it is checked whether the light transmission characteristic A1 of the optical filter 150 shown in FIG. 8 (FIG. 7) is suitable for the imaging system. The wavelength f_ext of excitation light emitted in the imaging system is a wavelength between the upper limit wavelength f_low of the visible light transmitted by the optical filter 150 and the lower limit wavelength f_high of the near infrared light transmitted by the optical filter 150. That is, the optical filter 150 shields light in a range from a wavelength longer than the wavelength f_low to a wavelength shorter than the wavelength f_high, and thus shields the excitation light emitted by the imaging system. In addition, the lower limit wavelength f_high of the near infrared light transmitted by the optical filter 150 is a wavelength shorter than the wavelength f_light of the near infrared light at which the specific protein has emitted fluorescence. For this reason, the solid-state imaging device 50 is able to acquire a near infrared light image that does not include excitation light but includes only near infrared light by which fluorescence is emitted, by the photoelectric conversion unit 102 of a near infrared light detection pixel. Accordingly, the light transmission characteristic A1 of the optical filter 150 shown in FIG. 8 is suitable for an imaging system such as a medical system which diagnoses using a fluorescent agent that is excited by near infrared light and emits fluorescence.

In this manner, since the solid-state imaging device 50 separates visible light and near infrared light with high accuracy, the solid-state imaging device 50 is mounted in various imaging systems (imaging applications), and thereby it is possible to realize various functions in the imaging system (imaging application) equipped with the solid-state imaging device 50.

As a method for realizing a configuration of the solid-state imaging device 50 (that is, a method for including the optical filter 150), in a manufacturing process of the solid-state imaging device 50, a method for affixing the optical filter 150 to the solid-state imaging device 10 of the first embodiment will be considered. However, the method for realizing a configuration of the solid-state imaging device 50 is not limited to this method. For example, when the solid-state imaging device 10 of the first embodiment is assembled into an imaging unit of the imaging system (that is, in an assembly process of the imaging unit), the configuration of the solid-state imaging device 50 may be realized by inserting the optical filter 150 between an optical lens for collecting light (rays of light) on the solid-state imaging device 10 and the solid-state imaging device 50.

Sixth Embodiment

Figure 9:
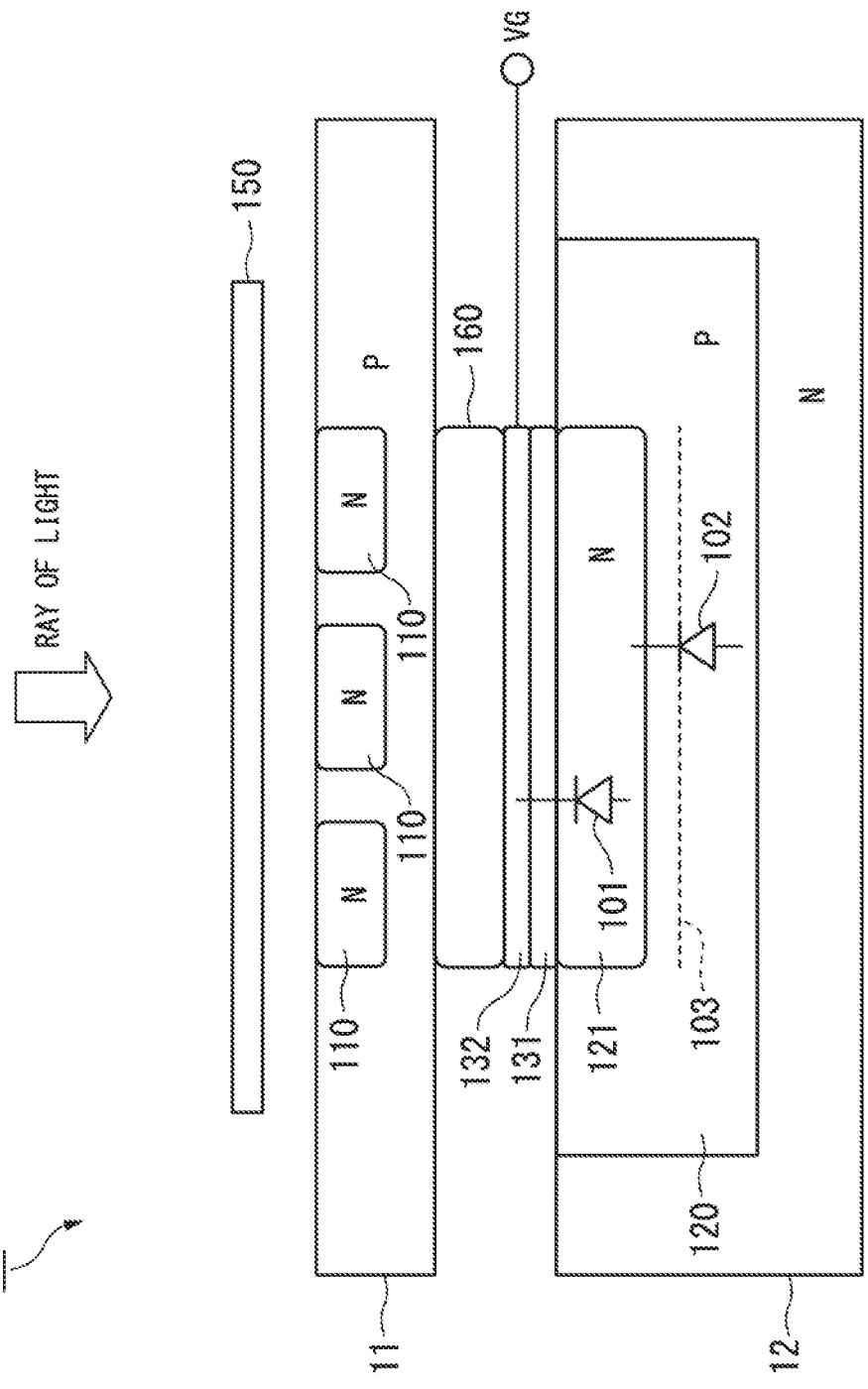
FIG. 9 is a diagram which shows a schematic structure of a solid-state imaging device according to a sixth embodiment of the present invention.

Next, a solid-state imaging device according to a sixth embodiment of the present invention will be described. FIG. 9 is a diagram which shows a schematic structure of the solid-state imaging device according to the sixth embodiment of the present invention. A solid-state imaging device 60 of the sixth embodiment, like the solid-state imaging device 50 of the fifth embodiment, is also configured by stacking a plurality of semiconductor substrates. FIG. 9, like the solid-state imaging device 50 of the fifth embodiment, in the solid-state imaging device 60 of a configuration in which the first semiconductor substrate 11 and the second semiconductor substrate 12 are stacked (joined), also shows the schematic structure as a vertical structure of a portion of a pixel array portion formed in the solid-state imaging device 60 as seen from a side surface.

A configuration of the first semiconductor substrate 11 and the second semiconductor substrate 12 configuring the solid-state imaging device 60 includes the same configuration elements as the configuration of the first semiconductor substrate 11 and the second semiconductor substrate 12 in the solid-state imaging device 50 according to the fifth embodiment. Accordingly, in the following description, only differences between the solid-state imaging device 60 and the solid-state imaging device 50 of the fifth embodiment will be described, and the same configurations as the solid-state imaging device 50 of the fifth embodiment will be given the same reference numerals and a detailed description thereof will be omitted.

The solid-state imaging device 60 of the sixth embodiment, like the solid-state imaging device 50 of the fifth embodiment, is also a solid-state imaging device which is able to acquire a visible light image and a near infrared light image. The solid-state imaging device 60, like the solid-state imaging device 50 of the fifth embodiment, includes the optical filter 150. Furthermore, in the solid-state imaging device 60, the optical filter 160 is formed between the first semiconductor substrate 11 and the polysilicon gate electrode 132 formed in the second semiconductor substrate 12. This optical filter 160 has a characteristic of shielding (absorbing or reflecting) visible light of a wavelength equal to or less than a predetermined wavelength which has passed through the first semiconductor substrate 11 along with near infrared light.

The solid-state imaging device 60, like the solid-state imaging device 50 of the fifth embodiment, also has a function of detecting (absorbing) slight visible light which has passed through the first semiconductor substrate 11 by the photoelectric conversion unit 101 formed in the second semiconductor substrate 12, but the optical filter 160 is included for the function for more reliably suppressing visible light incident on the second semiconductor substrate 12. This optical filter 160 is able to function more effectively, for example, when the photoelectric conversion unit 102 of a near infrared light detection pixel has sensitivity to a wavelength shorter than the upper limit wavelength of the visible light transmitted by the optical filter 150, and is able to detect only near infrared light by the photoelectric conversion unit 102 of a near infrared light detection pixel with higher accuracy.

Figure 10:
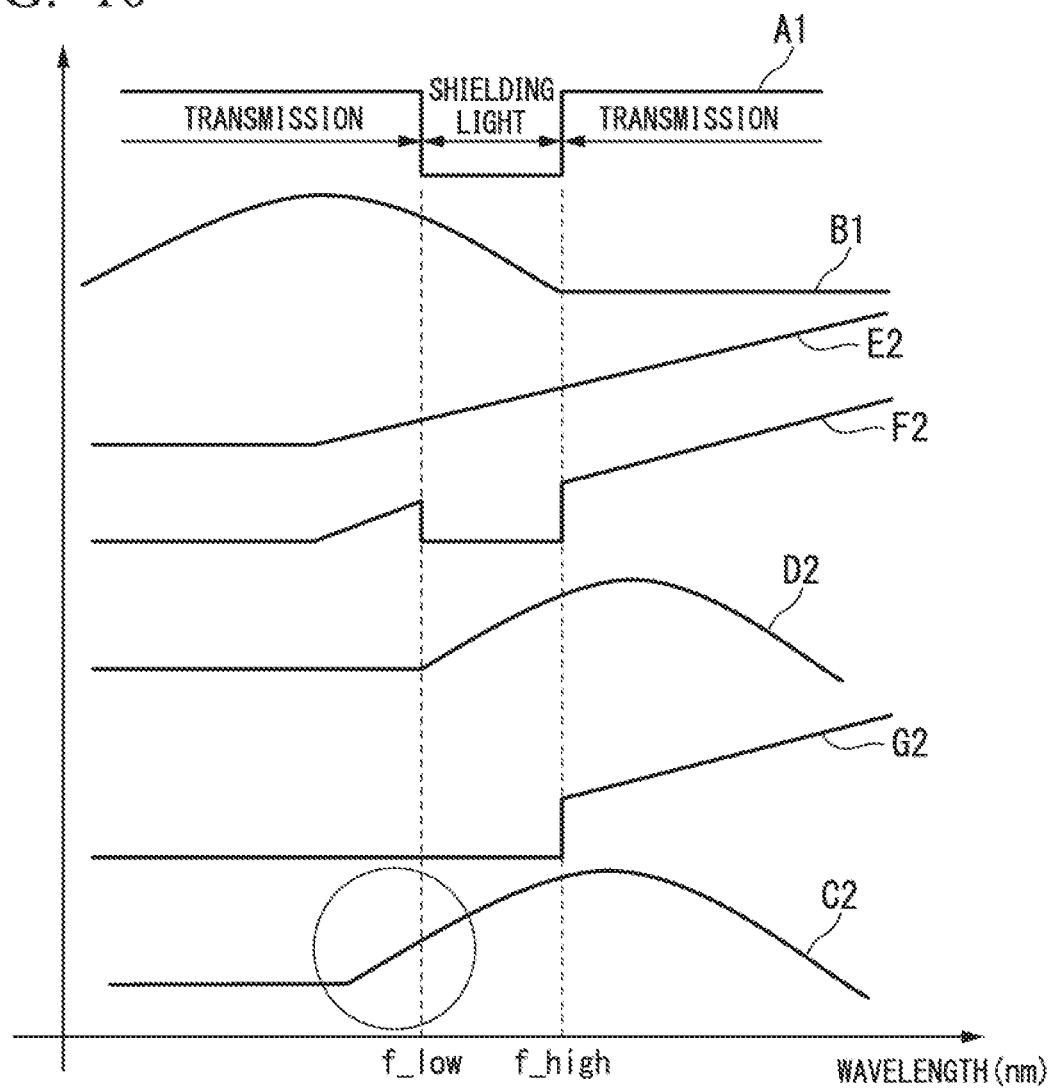
FIG. 10 is a diagram which describes a transmission characteristic of an optical filter provided in the solid-state imaging device according to the sixth embodiment of the present invention.

Here, a relationship between light at each position in the solid-state imaging device 60, transmission characteristics of the optical filter 150 and the optical filter 160, and spectral sensitivities of a visible light detection pixel and a near infrared light detection pixel will be described. FIG. 10 is a diagram which describes the transmission characteristics of an optical filter (the optical filter 150 and the optical filter 160) provided in the solid-state imaging device 60 according to a sixth embodiment of the present invention. FIG. 10, with a wavelength of light as a horizontal axis, shows an example of the light transmission characteristic A1 of the optical filter 150, the spectral sensitivity characteristic B1 of the photoelectric conversion unit of a visible light detection pixel, the spectral sensitivity characteristic C2 of the photoelectric conversion unit 102 of a near infrared light detection pixel, and a light transmission characteristic D2 of the optical filter 160 in respective graphs. In addition, FIG. 10 also shows an example of a light transmission characteristic E2 at a position of the visible light detection pixel, a characteristic F2 of light passing through the first semiconductor substrate 11, and a characteristic G2 of light that has passed through the optical filter 160 together in graphs. A vertical axis in FIG. 10 also represents a level of transmittance or sensitivity with respect to the wavelength of light shown by the horizontal axis, but in FIG. 10, respective graphs are shown separately like the graphs for characteristics of the fifth embodiment shown in FIG. 7, and thus respective graphs do not represent an absolute level of transmittance or sensitivity.

The light transmission characteristic A1 of the optical filter 150 shown in FIG. 10 and the spectral sensitivity characteristic B1 of the photoelectric conversion unit of a visible light detection pixel are the same as respective characteristics shown in FIG. 7, and thus a detailed description thereof will be omitted.

A case in which a light transmission characteristic at the position of a visible light detection pixel in the first semiconductor substrate 11 is the light transmission characteristic E2 shown in FIG. 10 will be considered. In this case, as shown in the characteristic F2 of light passing through the first semiconductor substrate 11 shown in FIG. 10, both the near infrared light of the wavelength equal to or greater than the wavelength f_high (for example, 800 nm) which is the lower limit wavelength of the near infrared light transmitted by the optical filter 150 and the visible light of the wavelength equal to or less than the wavelength f_low (for example, 700 nm) which is the upper limit wavelength of the visible light transmitted by the optical filter 150 are incident on the second semiconductor substrate 12.

If the spectral sensitivity characteristic of the photoelectric conversion unit 102 of a near infrared light detection pixel is the spectral sensitivity characteristic C2 shown in FIG. 10, the photoelectric conversion unit 102 of a near infrared light detection pixel may detect the visible light which is not shielded by the optical filter 150. That is, when the photoelectric conversion unit 102 of a near infrared light detection pixel also has sensitivity to light of a wavelength equal to or less than the wavelength f_low which is the upper limit wavelength of the visible light transmitted by the optical filter 150, visible light of a wavelength equal to or less than the wavelength f_low (refer to a range indicated by a circle in FIG. 10) may leak into the near infrared light detected by the photoelectric conversion unit 102. Then, if the photoelectric conversion unit 102 of a near infrared light detection pixel detects the visible light of a wavelength equal to or less than the wavelength f_low, the photoelectric conversion unit 102 of a near infrared light detection pixel does not detect only the near infrared light.

Therefore, in the solid-state imaging device 60, a light transmission characteristic of the optical filter 160 is set to be the light transmission characteristic D2. More specifically, the lower limit wavelength of the near infrared light transmitted by the optical filter 160 is set to be a wavelength longer than the wavelength f_low which is the upper limit wavelength of the visible light transmitted by the optical filter 150. The lower limit wavelength of the infrared light transmitted by the optical filter 160 is set to be a wavelength shorter than the wavelength f_high which is the lower limit wavelength of the near infrared light transmitted by the optical filter 150. That is, a transmittance of the visible light of a wavelength equal to or less than the wavelength f_low is set as zero by the optical filter 160, and the visible light incident on the second semiconductor substrate 12 is shielded by the optical filter 150 and the optical filter 160.

By the optical filter 150 and the optical filter 160, only the near infrared light of a wavelength equal to or greater than the wavelength f_high which is the lower limit wavelength of the near infrared light transmitted by the optical filter 150 is made to be incident on the second semiconductor substrate 12, as in the characteristic G2 of light transmitted by the optical filter 160 shown in FIG. 10.

As described above, the light transmission characteristic of the optical filter 160 is set to be the light transmission characteristic D2, and thereby light (visible light) of a wavelength shorter than the wavelength f_high is not detected by the photoelectric conversion unit 102 of a near infrared light detection pixel formed in the second semiconductor substrate 12 of the solid-state imaging device 60. Accordingly, the solid-state imaging device 60 is able to separate visible light, and near infrared light of a specific wavelength, with higher accuracy and detect each type of light.

As described above, the solid-state imaging device 60, like the solid-state imaging device 50 of the fifth embodiment, is able to separate visible light and near infrared light with high accuracy detect the visible light by the photoelectric conversion unit of a visible light detection pixel, and detect only the near infrared light of a specific wavelength by the photoelectric conversion unit 102 of a near infrared light detection pixel. In addition, the solid-state imaging device 60 includes the optical filter 160 with a transmission characteristic determined on the basis of the spectral sensitivity characteristic C2 of the photoelectric conversion unit 102 of a near infrared light detection pixel. With such a configuration, in the solid-state imaging device 60, slight visible light that has passed through the first semiconductor substrate 11 is suppressed before being incident on the second semiconductor substrate 12, and the slight visible light is more reliably suppressed by the photoelectric conversion unit 101. Accordingly, in the solid-state imaging device 60, it is possible to separate the visible light and the near infrared light with higher accuracy, and to detect only near infrared light of a specific wavelength by the photoelectric conversion unit 102 of a near infrared light detection pixel.

For example, in the solid-state imaging device 60 including the optical filter 150 with the light transmission characteristic A1 shown in FIG. 10 and the optical filter 160 with the light transmission characteristic D2, it is possible to perform detection of each type of the visible light of a wavelength equal to or less than the wavelength f_low (for example, 700 nm), and the near infrared light of a wavelength equal to or greater than the wavelength f_high (for example, 800 nm), by separating them with further higher accuracy than in the solid-state imaging device 50 of the fifth embodiment. As a result, for example, when the solid-state imaging device 60 is mounted on an imaging system (imaging application) such as a monitoring camera, it is possible to separate and detect near infrared light of 850 nm or 940 nm emitted by near infrared light illumination (for example, LED illumination) which has been widely used in monitoring cameras and the like with high accuracy, and to obtain a near infrared light image with higher definition. Moreover, when the solid-state imaging device 60 is mounted on, for example, a medical imaging system (imaging application), it is possible to separate and detect a wavelength of near infrared light which is emits fluorescence and photographing in the medical imaging system, and a wavelength of the near infrared light of the near infrared illumination with high accuracy, and to obtain a near infrared light image with higher definition.

In the solid-state imaging device 60, it is assumed that the optical filter 160 is formed, for example, in a manufacturing process for forming the second semiconductor substrate 12 (that is, a manufacturing process of a semiconductor), and thus a transmission characteristic in a range transmitting near infrared light in the light transmission characteristic D2 of the optical filter 160 is indicated in the form of an arch as shown in FIG. 10. However, a method of forming the optical filter 160 is not limited to the forming method in the semiconductor manufacture process. For example, an optical filter with the same characteristic as the optical filter 160 may be produced separately from the semiconductor manufacturing process, and the optical filter 160 may be formed by bonding the optical filter in a process of stacking the first semiconductor substrate 11 and the second semiconductor substrate 12. In this case, the light transmission characteristic D2 of the optical filter 160 is considered to be a transmission characteristic with a transmittance at a wavelength transmitting near infrared light rising steeply, like the light transmission characteristic A1 of the optical filter 150.

In addition, a case of the solid-state imaging device 60 in which the optical filter 160 is formed in the solid-state imaging device 50 of the fifth embodiment including the optical filter 150 in the solid-state imaging device 10 of the first embodiment will be described. However, the optical filter 160 is able to also be formed in a solid-state imaging device in which a silicon oxide film 133 (that is, an anti-reflection film) is formed between the first semiconductor substrate 11 and the polysilicon gate electrode 132 formed in the second semiconductor substrate 12, like the solid-state imaging device 30 of the third embodiment. In this case, the optical filter 160 is formed between the silicon oxide film 133 and the polysilicon gate electrode 132 formed in the second semiconductor substrate 12.

A case in which the optical filter 160 has light transmittance of zero at a wavelength longer than the wavelength f_low (that is, a high pass type optical filter) as shown in the graph of the light transmission characteristic D2 of the optical filter 160 shown in FIG. 10 will be described. However, the transmission characteristic of the optical filter 160 may be a transmission characteristic which is able to shield visible light of a wavelength equal to or less than the upper limit wavelength of the visible light transmitted by the optical filter 150, which may be detected by the photoelectric conversion unit 102 of a near infrared light detection pixel. Accordingly, in the optical filter 160, there is no particular restriction on the transmission characteristic for light of a wavelength shorter than a lower limit wavelength to which the photoelectric conversion unit 102 of a near infrared light detection pixel has sensitivity. This is because visible light of a wavelength shorter than the lower limit wavelength to which the photoelectric conversion unit 102 of a near infrared light detection pixel has sensitivity does not affect detection of near infrared light by the photoelectric conversion unit 102 of a near infrared light detection pixel even if the visible light passes through the optical filter 160 and is incident on the second semiconductor substrate 12.

Accordingly, if it is possible to form the optical filter 160 more easily, the optical filter 160 may have a transmission characteristic which is able to shield visible light of a predetermined wavelength equal to or less than the lower limit wavelength to which the photoelectric conversion unit 102 of a near infrared light detection pixel has sensitivity and near infrared light of a wavelength at any position in a range from a wavelength longer than the wavelength f_low to a wavelength shorter than the wavelength f_high. Therefore, if the transmission characteristic is suitable, the optical filter 160 may be configured as a so-called notch type (band illuminated type) optical filter the same as the optical filter 150.

Figure 11:
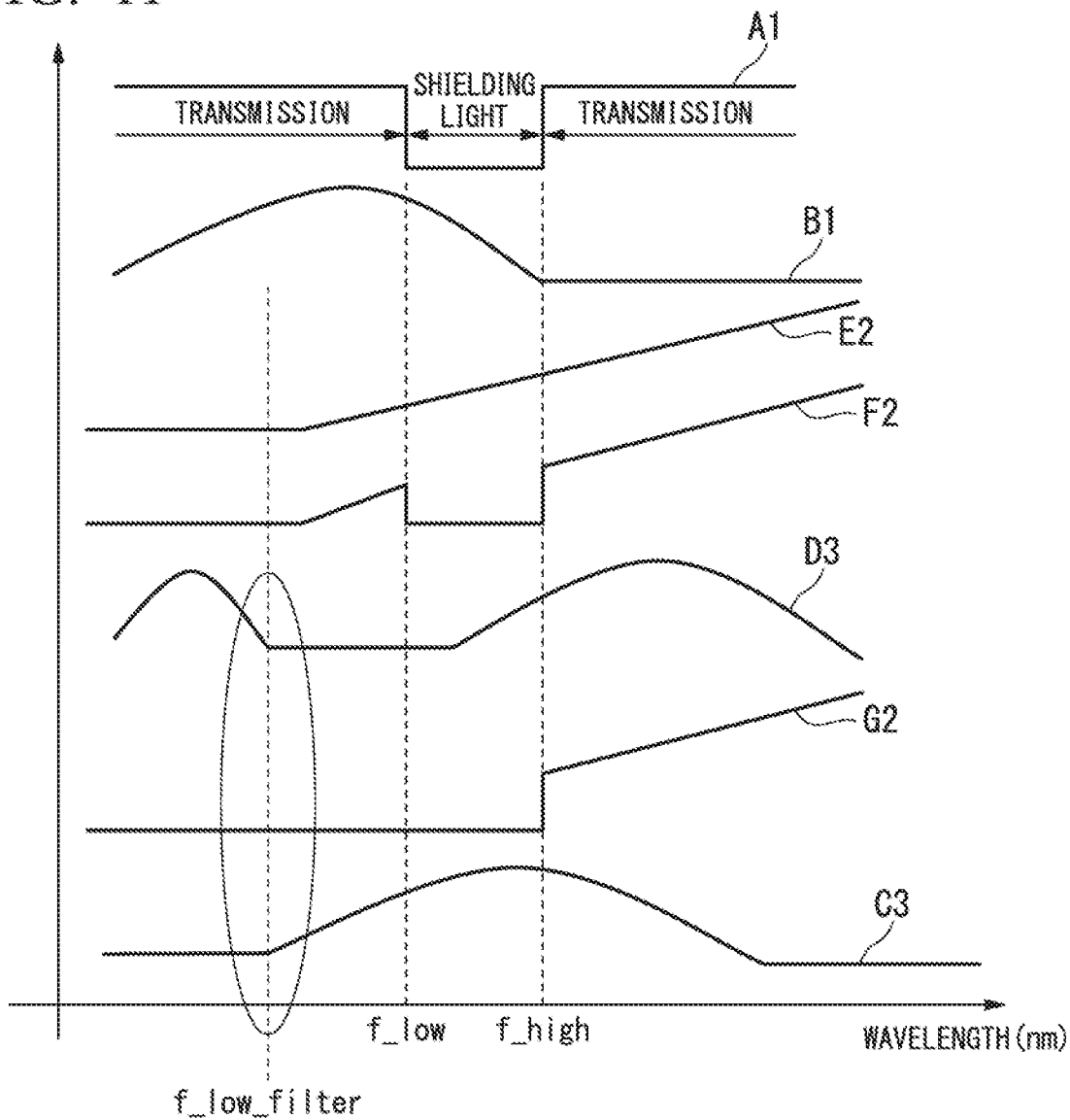
FIG. 11 is a diagram which describes other transmission characteristics of the optical filter provided in the solid-state imaging device according to the sixth embodiment of the present invention.

Here, an example of a case in which the optical filter 160 is configured as a notch type (band illuminated type) optical filter will be described. FIG. 11 is a diagram which describes other transmission characteristic of the optical filter 160 provided in the solid-state imaging device 60 of the sixth embodiment of the present invention. FIG. 11, with a wavelength of light as a horizontal axis, shows, like respective characteristics with respect to a wavelength of light in the solid-state imaging device 60 shown in FIG. 10, an example of the light transmission characteristic A1 of the optical filter 150, the spectral sensitivity characteristic B1 of the photoelectric conversion unit of a visible light detection pixel, a spectral sensitivity characteristic C3 of the photoelectric conversion unit 102 of a near infrared light detection pixel, and a light transmission characteristic D3 of the optical filter 160 in respective graphs. Moreover, FIG. 11 also shows, like respective characteristics with respect to a wavelength of light in the solid-state imaging device 60 shown in FIG. 10, an example of the light transmission characteristic E2 at a position of the visible light detection pixel, the characteristic F2 of light passing through the first semiconductor substrate 11, and a characteristic G2 of light that has passed through the optical filter 160 together in graphs. A vertical axis in FIG. 11 also represents a level of transmittance or sensitivity with respect to the wavelength of light shown by the horizontal axis, but does not represent an absolute level of transmittance or sensitivity.

Each of the light transmission characteristic A1 of the optical filter 150, the spectral sensitivity characteristic B1 of the photoelectric conversion unit of a visible light detection pixel, the light transmission characteristic E2 at a position of a visible light detection pixel, the characteristic F2 of light passing through the first semiconductor substrate 11, and the characteristic G2 of light that has passed through the optical filter 160 shown in FIG. 11 are the same as each of the characteristics shown in FIG. 10, and thus a detailed description thereof will be omitted.

Visible light which is highly likely to pass through the first semiconductor substrate 11 is considered to be visible light corresponding to red (R) whose wavelength is close to near infrared light. In other words, visible light corresponding to blue (B) and visible light corresponding to green (G), whose wavelengths are apart from the near infrared light are considered unlikely to pass through the first semiconductor substrate 11. FIG. 11 shows a graph of the light transmission characteristic D3 of the optical filter 160 in a case in which an organic or inorganic optical filter (notch type optical filter) for a visible light detection pixel corresponding to blue (B), which transmits both visible light and near infrared light of a wavelength corresponding to blue (B), is set as the optical filter 160.

A case in which a spectral sensitivity characteristic of the photoelectric conversion unit 102 of a near infrared light detection pixel is the spectral sensitivity characteristic C3 shown in FIG. 11 (that is, a case in which the photoelectric conversion unit 102 of a near infrared light detection pixel has sensitivity to light of a wavelength f_low_filter) will be considered. Here, a case in which the light transmission characteristic of the optical filter 160 is a transmission characteristic whose transmittance is zero from a wavelength equal to or less than the wavelength f_low_filter to which the photoelectric conversion unit 102 of a near infrared light detection pixel has sensitivity and rises from a position of any wavelength in a range from a wavelength longer than the wavelength f_low to a wavelength shorter than the wavelength f_high as in the light transmission characteristic D3 shown in FIG. 11 is considered. That is, as shown in a range indicated by a circle in FIG. 11, it is assumed that there is no overlap between a wavelength at which transmittance of the optical filter 160 is zero and the wavelength f_low_filter to which the photoelectric conversion unit 102 of a near infrared light detection pixel has sensitivity. In this case, even when visible light, as in the light characteristic F2, has passed through the first semiconductor substrate 11, light with a characteristic the same as the light characteristic G2 of light which has passed through the optical filter 160 shown in FIG. 11 is incident on the second semiconductor substrate 12 by the optical filter 160 and the optical filter 150. That is, visible light or near infrared light at a wavelength shorter than the wavelength f_high which is a lower limit wavelength of near infrared light transmitted by the optical filter 150 is not incident on the second semiconductor substrate 12.

Accordingly, in the photoelectric conversion unit 102 of a near infrared light detection pixel formed in the second semiconductor substrate 12, light (visible light) of a wavelength shorter than the wavelength f_high is not detected. In this manner, even when the optical filter 160 formed in the second semiconductor substrate 12 in the solid-state imaging device 60 is an organic or inorganic optical filter (notch type optical filter) for a visible light detection pixel corresponding to blue (B), it is possible to separate visible light and near infrared light of a specific wavelength with higher accuracy and to detect each type of light.

In FIG. 11, a case in which the light transmission characteristic of the optical filter 160 is a transmission characteristic of the organic or inorganic optical filter (notch type optical filter) for a visible light detection pixel corresponding to blue (B) is described. However, as described above, the optical filter 160 may have a transmission characteristic which is able to shield visible light of a wavelength equal to or less than the lower limit wavelength to which the photoelectric conversion unit 102 of a near infrared light detection pixel has sensitivity and near infrared light of a wavelength at any position in a range from a wavelength longer than the wavelength f_low to a wavelength shorter than the wavelength f_high. Accordingly, when the transmission characteristic is suitable, the optical filter 160 may be configured as the organic or inorganic optical filter (notch type optical filter) for a visible light detection pixel corresponding to green (G). That is, the optical filter 160 may have a transmission characteristic which is able to shield at least visible light corresponding to red (R) whose wavelength is close to a wavelength of near infrared light.

According to the sixth embodiment, a solid-state imaging device (solid-state imaging device 60) has a configuration in which a second optical filter (optical filter 160) which is disposed between a first semiconductor substrate (the first semiconductor substrate 11) and a conductive layer (the polysilicon gate electrode 132) and shields light of a wavelength equal to or less than a predetermined third wavelength is further included and the third wavelength is equal to or greater than a first wavelength (a wavelength longer than the wavelength f_low) and equal to or less than a second wavelength (a wavelength shorter than the wavelength f_high).

In addition, according to the sixth embodiment, the solid-state imaging device 60 is configured so that a lower limit wavelength of light shielded by the optical filter 160 is a wavelength equal to or less than the lower limit wavelength of light (wavelength f_low_filter) photoelectrically converted by a second photoelectric conversion layer (the photoelectric conversion unit 102 of a near infrared light detection pixel).

Moreover, according to the sixth embodiment, the solid-state imaging device 60 is configured so that the optical filter 160 shields at least light (visible light) of the wavelength of red (R).

As described above, the solid-state imaging device of the fifth embodiment and the sixth embodiment of the present invention includes an optical filter (the optical filter 150 or the optical filter 160) with a transmission characteristic determined on the basis of the spectral sensitivity characteristic of the photoelectric conversion unit of a visible light detection pixel or the spectral sensitivity characteristic of the photoelectric conversion unit 102 of a near infrared light detection pixel. Accordingly, in the solid-state imaging device of the fifth embodiment and the sixth embodiment of the present invention, it is possible to optically separate visible light and near infrared light, detect the visible light by the photoelectric conversion unit of a visible light detection pixel, and detect only the near infrared light of a specific wavelength by the photoelectric conversion unit 102 of a near infrared light detection pixel. Then, in an imaging system (imaging application) equipped with the solid-state imaging device of the fifth embodiment and the sixth embodiment of the present invention, it is possible to simultaneously obtain both a visible light image and a near infrared light image and execute processing using each of the images.

A configuration in which visible light and near infrared light is able to be separated with high accuracy, only the visible light is able to be detected by the photoelectric conversion unit of a visible light detection pixel, and only the near infrared light is able to be detected by the photoelectric conversion unit 102 of a near infrared light detection pixel is considered in a configuration other than the optical configuration described above.

Seventh Embodiment

Figure 12:
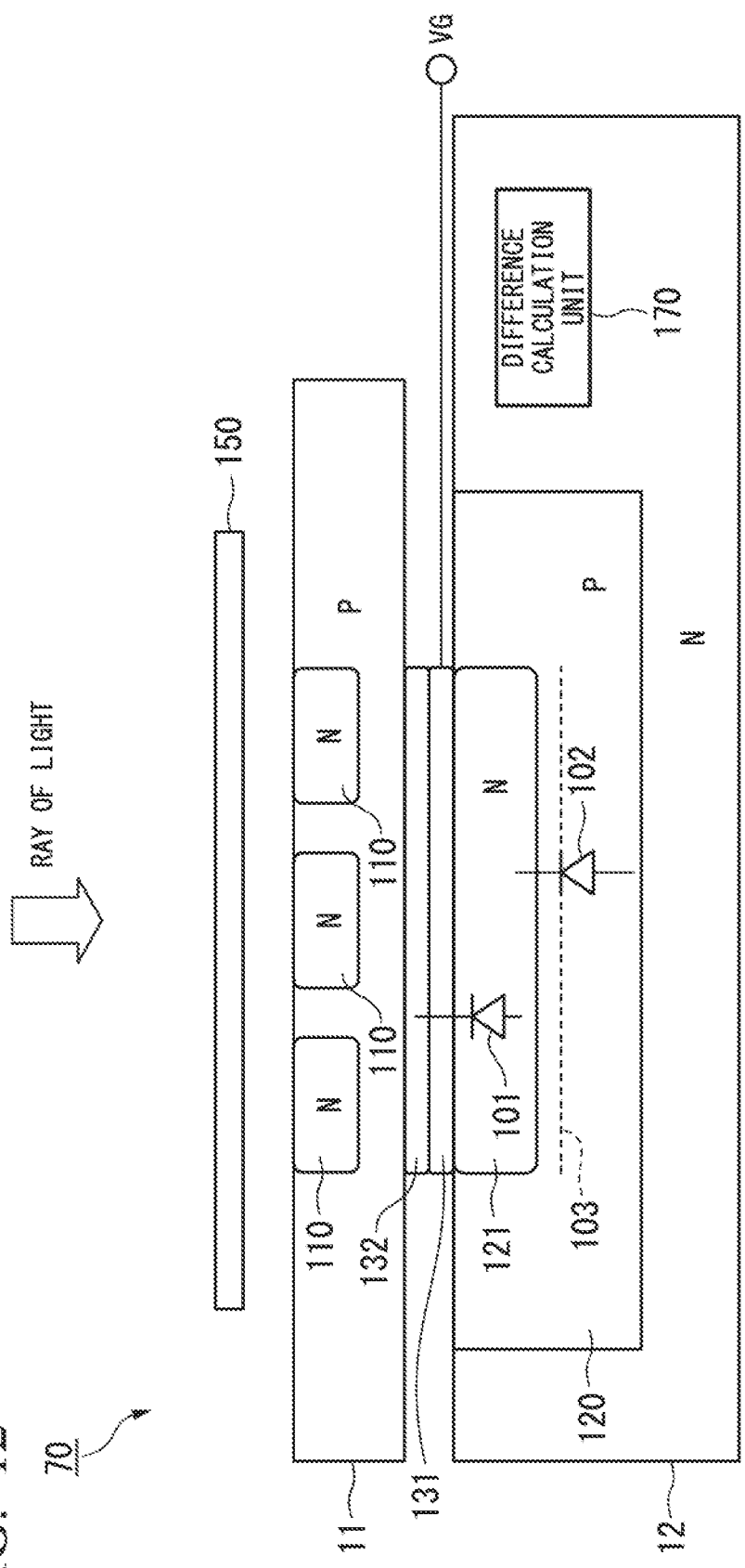
FIG. 12 is a diagram which shows a schematic structure of a solid-state imaging device according to a seventh embodiment of the present invention.

Next, a solid-state imaging device according to a seventh embodiment of the present invention will be described. FIG. 12 is a diagram which shows a schematic structure of the solid-state imaging device according to the seventh embodiment of the present invention. The solid-state imaging device 70 of the seventh embodiment is configured so that processing for detecting visible light and near infrared light is performed in the solid-state imaging device 50 of the fifth embodiment based on an electric signal (pixel signal) photoelectrically converted by each photoelectric conversion unit. FIG. 12 also shows the schematic structure as a vertical structure of a portion of a pixel array portion formed in the solid-state imaging device 70 as seen from a side surface. In the following description, only differences between the solid-state imaging device 70 and the solid-state imaging device 50 of the fifth embodiment will be described, and the same configurations as the solid-state imaging device 50 of the fifth embodiment will be given the same reference numerals and a detailed description thereof will be omitted.

The solid-state imaging device 70 of the seventh embodiment, like the solid-state imaging device 50 of the fifth embodiment, is also a solid-state imaging device which is able to acquire a visible light image and a near infrared light image. However, in the solid-state imaging device 70, a difference calculation unit 170 for performing processing on a photoelectrically converted pixel signal by each photoelectric conversion unit is included in the second semiconductor substrate 12.

The difference calculation unit 170 performs a calculation for correcting a pixel signal which is obtained by detecting and photoelectrically converting near infrared light by the photoelectric conversion unit 102 of a near infrared light detection pixel formed in the second semiconductor substrate 12. More specifically, the difference calculation unit 170 performs a calculation for excluding visible light detected as near infrared light on the basis of a photoelectrically converted pixel signal by the photoelectric conversion unit 102 of a near infrared light detection pixel when near infrared light is emitted (hereinafter referred to as "near infrared light emission pixel signal"), and a photoelectrically converted pixel signal by the photoelectric conversion unit 102 of a near infrared light detection pixel when near infrared light is not emitted (hereinafter referred to as "near infrared light non-emission pixel signal"). Accordingly, the difference calculation unit 170 is able to generate a pixel signal including only the near infrared light detected by the photoelectric conversion unit 102 of a near infrared light detection pixel.

In the solid-state imaging device 70, as described above, respective pixel signals (near infrared light emission pixel signal and near infrared light non-emission pixel signal) are obtained in respective cases when near infrared light is emitted and when near infrared light is not emitted. An imaging system (imaging application) equipped with the solid-state imaging device 70 needs to include near infrared light illumination (for example, LED illumination) for emitting near infrared light.

Figure 13:
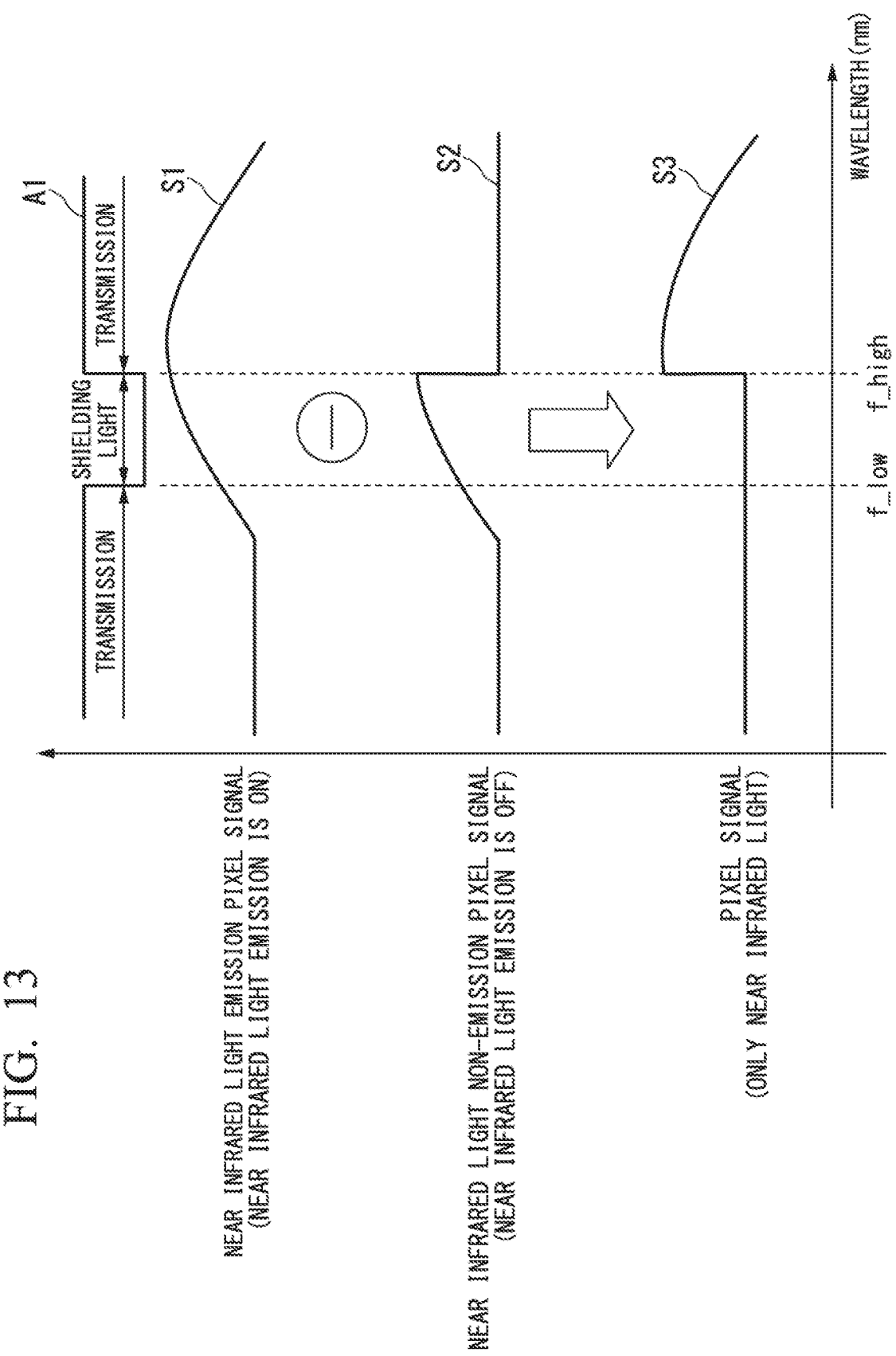
FIG. 13 is a diagram which schematically shows processing in an imaging system equipped with the solid-state imaging device according to the seventh embodiment of the present invention.

Here, processing for generating a pixel signal containing only the near infrared light detected by the photoelectric conversion unit 102 of a near infrared light detection pixel in an imaging system equipped with the solid-state imaging device 70 is described. FIG. 13 is a diagram which schematically shows processing in the imaging system equipped with the solid-state imaging device 70 according to the seventh embodiment of the present invention. FIG. 13, with a wavelength of light as a horizontal axis, shows an example of the light transmission characteristic A1 of the optical filter 150, and a wavelength component of light contained in a pixel signal in each processing stage in respective graphs. A vertical axis in FIG. 13 represents transmittance with respect to the wavelength of light shown by the horizontal axis, or an amount of the wavelength component contained in a pixel signal, but in FIG. 13, respective graphs are shown separately for ease of description, and thus respective graphs do not represent an absolute level of transmittance or an absolute amount of the wavelength component. In the following description, respective graphs shown in FIG. 13 are appropriately referred to.

First, the imaging system performs photographing in a state in which near infrared light is emitted through the near infrared light illumination (a state in which emission of near infrared light is ON). In the photographing at this time, the difference calculation unit 170 acquires the near infrared light emission pixel signal containing the wavelength in the range of the graph S1 shown in FIG. 13 from the photoelectric conversion unit 102 of a near infrared light detection pixel. This near infrared light emission pixel signal S1 contains a component of near infrared light and a component of visible light detected as near infrared light (that is, visible light which has passed through the first semiconductor substrate 11 (which has leaked into the near infrared light detected by the photoelectric conversion unit 102)).

Thereafter, the imaging system performs photographing in a state in which emission of near infrared light through the near infrared light illumination stops (a state in which emission of near infrared light is OFF). In the photographing at this time, the difference calculation unit 170 acquires a pixel signal from the photoelectric conversion unit of a visible light detection pixel, and a near infrared light non-emission pixel signal containing the wavelength of the range of the graph S2 shown in FIG. 13 from the photoelectric conversion unit 102 of a near infrared light detection pixel. This near infrared light non-emission pixel signal S2 contains a component of visible light (in FIG. 13, a component of a wavelength shorter than the wavelength f_high (for example, 800 nm)). This component of visible light is a component detected as near infrared light even when emission of near infrared light is in an off state, and is a component of visible light which has passed through the first semiconductor substrate 11 (which has leaked into the near infrared light detected by the photoelectric conversion unit 102).

Then, the difference calculation unit 170 calculates a difference between the near infrared light emission pixel signal S1 and the near infrared light non-emission pixel signal S2. Accordingly, the difference calculation unit 170 generates a pixel signal S3 containing the wavelength of the range of the graph S3 shown in FIG. 13 (that is, containing only a component of the near infrared light detected by the photoelectric conversion unit 102 of a near infrared light detection pixel).

An imaging signal containing only the component of visible light is a pixel signal from the photoelectric conversion unit of a visible light detection pixel which is obtained by the photographing performed in a state in which the emission of near infrared light is OFF.

In the processing described above, a case in which the difference calculation unit 170 performs processing for obtaining a pixel signal containing only the component of near infrared light on the basis of only a pixel signal acquired from the photoelectric conversion unit 102 of a near infrared light detection pixel is described. However, the same approach may be applied to the pixel signal acquired by the photoelectric conversion unit of a visible light detection pixel. For example, the difference calculation unit 170 calculates a difference between the pixel signal from the photoelectric conversion unit of a visible light detection pixel which is obtained in a state in which the emission of near infrared light is ON and the pixel signal from the photoelectric conversion unit of a visible light detection pixel which is obtained in a state in which the emission of near infrared light is OFF, thereby generating a pixel signal containing only the component of near infrared light detected by the photoelectric conversion unit of a visible light detection pixel. In addition, the difference calculation unit 170 adds the pixel signal containing only the component of near infrared light generated herein to the pixel signal S3 containing only the component of the near infrared light detected by the photoelectric conversion unit 102 of a near infrared light detection pixel, thereby generating a pixel signal of a near infrared light component including the pixel signal detected (absorbed) by the photoelectric conversion unit of a visible light detection pixel.

In this manner, in the solid-state imaging device 70, processing is performed on a photoelectrically converted pixel signal by each photoelectric conversion unit, and thereby it is also possible to obtain a pixel signal which has detected each type of light by separating visible light, and near infrared light of a specific wavelength.

According to the seventh embodiment, a solid-state imaging device (the solid-state imaging device 70) is configured to further include a calculation processing unit (the difference calculation unit 170) which generates an electric signal (pixel signal) containing only near infrared light on the basis of a first electric signal (the near infrared light emission pixel signal) photoelectrically converted by a second photoelectric conversion layer (the photoelectric conversion unit 102 of a near infrared light detection pixel) when near infrared light is emitted, and a second electric signal (the near infrared light non-emission pixel signal) photoelectrically converted by the photoelectric conversion unit 102 of a near infrared light detection pixel when near infrared light is not emitted.

As described above, the solid-state imaging device 70 includes the difference calculation unit 170 which performs calculation for correcting a pixel signal. With such a configuration, the solid-state imaging device 70 performs calculation processing on a photoelectrically converted pixel signal by each photoelectric conversion unit. Accordingly, in the solid-state imaging device 70, in a manner other than the optical configuration, it is possible to separate visible light, and near infrared light of a specific wavelength and obtain a pixel signal which has detected each type of light.

For example, in an example shown in FIG. 13, it is possible to obtain a pixel signal which has detected near infrared light of a wavelength equal to or greater than the wavelength f_high (for example, 800 nm). Accordingly, even in the imaging system (imaging application) equipped with the solid-state imaging device 70, it is possible to realize a function of detecting near infrared light of a specific wavelength such as 850 nm or 940 nm at which light is emitted through the near infrared light illumination (for example, LED illumination).

In a configuration of the solid-state imaging device 70 shown in FIG. 12, a case in which the difference calculation unit 170 is included in the second semiconductor substrate 12 is described, but a place for including the difference calculation unit 170 is not limited to the second semiconductor substrate 12. For example, the solid-state imaging device 70 may have a configuration in which the difference calculation unit 170 is included in the first semiconductor substrate 11 configuring the solid-state imaging device 70. In addition, the solid-state imaging device 70 may also have a configuration in which the difference calculation unit 170 is not included, and, for example, one of processing units included in the imaging system (imaging application) equipped with the solid-state imaging device 70 realizes a function of the difference calculation unit 170.

As described above, according to each embodiment of the present invention, a solid-state imaging device is configured by stacking a plurality of semiconductor substrates, a normal pixel which detects visible light is formed in the first semiconductor substrate disposed on an upper surface as seen from a side on which light (rays of light) is incident, and a near infrared light pixel which detects near infrared light is formed in the second semiconductor substrate disposed on a lower surface. At this time, in each embodiment of the present invention, a structure of an NPN semiconductor, and an insulation film and a conductive layer are formed in the second semiconductor substrate. Then, in each embodiment of the present invention, a photogate type photoelectric conversion unit (photodiode) is configured by a conductive layer, and an N-type semiconductor of a side on which a ray of light is incident in the structure of an NPN semiconductor, and a PN junction type photoelectric conversion unit (photodiode) is configured by a PN junction of the P-type semiconductor in the structure of an NPN semiconductor and the second semiconductor substrate which is an N-type semiconductor. With such a configuration, in each embodiment of the present invention, the photogate type photoelectric conversion unit functions as a pixel which detects and suppresses slight visible light that has passed through the first semiconductor substrate and the PN junction type photoelectric conversion unit functions as a near infrared light pixel. Accordingly, in each embodiment of the present invention, it is possible to separate visible light and near infrared light with high accuracy, to detect the visible light by a normal pixel, and to detect only near infrared light by the near infrared light pixel (that is, a PN junction type photoelectric conversion). Accordingly, in each embodiment of the present invention, it is possible to simultaneously acquire both a normal image obtained by visible light and an image obtained by near infrared light. Then, in an imaging system (imaging application) equipped with the solid-state imaging device according to each embodiment of the present invention, it is possible to realize various functions using the normal image obtained by visible light and the image obtained by near infrared light.

Moreover, in each embodiment of the present invention, an optical filter which has a characteristic of transmitting only light of a predetermined wavelength, which is determined on the basis of a spectral sensitivity of a photoelectric conversion unit of the normal pixel and a spectral sensitivity of the PN junction type photoelectric conversion of the near infrared light pixel, is included on a surface of a side on which light (rays of light) is incident in the solid-state imaging device. With such a configuration, in each embodiment of the present invention, it is possible to simultaneously acquire both the normal image obtained by the visible light and the image obtained by the near infrared light of a specific wavelength, by separating the visible light and the near infrared light with higher accuracy.

In addition, in each embodiment of the present invention, an optical filter of a transmission characteristic determined on the basis of the spectral sensitivity of the PN junction type photoelectric conversion of the near infrared light pixel is formed between the first semiconductor substrate and the conductive layer. Accordingly, in each embodiment of the present invention, slight visible light that has passed through the first semiconductor substrate is more reliably suppressed using the photogate type photoelectric conversion unit. With such a configuration, in each embodiment of the present invention, it is possible to simultaneously acquire both the normal image obtained by the visible light and the image obtained by the near infrared light of a specific wavelength, by separating the visible light and the near infrared light with further higher accuracy.

In each embodiment of the present invention, configurations of the solid-state imaging device which are different for each embodiment are shown. However, each embodiment does not have an exclusive configuration, and may simultaneously include configurations shown in other embodiments. That is, a plurality of configuration elements shown in the first to seventh embodiments may be provided at the same time. For example, in the solid-state imaging device 20 of the second embodiment, a solid-state imaging device which includes one configuration, a plurality of configurations, or all configurations of the silicon oxide film 133 shown in the third embodiment, the gate voltage control unit 140 shown in the fourth embodiment, the optical filter 150 shown in the fifth embodiment, the optical filter 160 shown in the sixth embodiment, and the difference calculation unit 170 shown in the seventh embodiment may be formed. Accordingly, in the present invention, it is possible to configure a solid-state imaging device which acquires each image that has separated visible light and near infrared light with further higher accuracy, and to realize various functions desired in the imaging system (imaging application) equipped with this solid-state imaging device.

In addition, in each embodiment of the present invention, a configuration of a solid-state imaging device obtained by stacking two semiconductor substrates of the first semiconductor substrate 11 and the second semiconductor substrate 12 is described. However, the number of substrates stacked in the solid-state imaging device is not limited to two, and more substrates may be stacked in the configuration.

While preferred embodiments of the present invention have been described and shown above, it should be understood that these are exemplary of the invention and the present invention is not limited to these embodiments and modified examples thereof. Within a range not departing from the gist or spirit of the present invention, additions, omissions, substitutions, and other modifications to the configuration can be made.

Further, the present invention is not to be considered as being limited by the foregoing description, and is limited only by the scope of the appended claims.

What is claimed is:

1. A solid-state imaging device comprising:
   a first semiconductor substrate in which first photoelectric conversion layers that photoelectrically convert incident light in a first wavelength band are formed in a two-dimensional matrix shape;
   a second semiconductor substrate in which second photoelectric conversion layers that photoelectrically convert incident light are formed in a two-dimensional matrix shape;
   a conductive layer which is disposed between the first semiconductor substrate and the second semiconductor substrate and has conductivity corresponding to the second photoelectric conversion layer; and
   an insulation film which is disposed between the second semiconductor substrate and the conductive layer and has an insulation property corresponding to the second photoelectric conversion layer,
   wherein light that has passed through the first photoelectric conversion layer, the conductive layer, and the insulation film is incident on the second semiconductor substrate,
   a predetermined voltage is applied to the conductive layer, and
   a wavelength of light in a second wavelength band which is photoelectrically converted by the second photoelectric conversion layer when the predetermined voltage is applied to the conductive layer is longer than a wavelength of light in a wavelength band which is photoelectrically converted by the second photoelectric conversion layer when the predetermined voltage is not applied to the conductive layer.

2. The solid-state imaging device according to claim 1, further comprising:
   a first optical filter which shields light of a wavelength from a predetermined first wavelength to a predetermined second wavelength longer than the first wavelength,
   wherein the first semiconductor substrate is disposed between the first optical filter and the second semiconductor substrate,
   an upper limit wavelength of the first wavelength band is a wavelength shorter than the first wavelength, and
   a lower limit wavelength of the second wavelength band is a wavelength longer than the second wavelength.

3. The solid-state imaging device according to claim 2, further comprising:
   a second optical filter which is disposed between the first semiconductor substrate and the conductive layer and shields light of a wavelength equal to or less than a predetermined third wavelength,
   wherein the third wavelength is equal to or greater than the first wavelength and equal to or less than the second wavelength.

4. The solid-state imaging device according to claim 3, wherein a lower limit wavelength of light shielded by the second optical filter is a wavelength equal to or less than a lower limit wavelength of light photoelectrically converted by the second photoelectric conversion layer.

5. The solid-state imaging device according to claim 4, wherein the second optical filter shields at least red wavelength light.

6. The solid-state imaging device according to claim 1, wherein the first photoelectric conversion layer and the second photoelectric conversion layer form a PN junction type photoelectric conversion unit, and
a first N-type semiconductor layer which forms the first photoelectric conversion layer is thinner than a second N-type semiconductor layer which forms the second photoelectric conversion layer.

7. The solid-state imaging device according to claim 6, wherein a concentration of impurities when the first N-type semiconductor layer is formed is the same as a concentration of impurities when the second N-type semiconductor layer is formed, or is higher than the concentration of impurities when the second N-type semiconductor layer is formed.

8. The solid-state imaging device according to claim 1, wherein the first photoelectric conversion layer has any one of a first color filter transmitting red wavelength light, a second color filter transmitting green wavelength light, and a third color filter transmitting blue wavelength light, which is disposed on a side on which light in the first wavelength band is incident, and
each of the first color filter, the second color filter, and the third color filter further transmits at least light in the second wavelength band.

9. The solid-state imaging device according to claim 1, further comprising:
an anti-reflection film which is disposed between the first semiconductor substrate and the conductive layer and prevents reflection of light that has passed through the first photoelectric conversion layer.

10. The solid-state imaging device according to claim 1, further comprising:
a gate voltage control unit which controls the predetermined voltage applied to the conductive layer.

11. The solid-state imaging device according to claim 10, wherein the gate voltage control unit controls the predetermined voltage to be different voltage values for each conductive layer corresponding to the second photoelectric conversion layer, or for each of the plurality of conductive layers.

12. The solid-state imaging device according to claim 1, further comprising:
a calculation processing unit which generates an electric signal containing only near infrared light on the basis of a first electric signal photoelectrically converted by the second photoelectric conversion layer when the near infrared light is emitted and a second electric signal photoelectrically converted by the second photoelectric conversion layer when the near infrared light is not emitted.

* * * * *